United States Patent
An et al.

(10) Patent No.: US 11,696,468 B2
(45) Date of Patent: Jul. 4, 2023

(54) DISPLAY APPARATUS

(71) Applicant: Samsung Display Co., Ltd., Yongin-si (KR)

(72) Inventors: Chiwook An, Yongin-si (KR); Soonil Jung, Yongin-si (KR); Sanghyun Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/562,955

(22) Filed: Dec. 27, 2021

(65) Prior Publication Data

US 2022/0123269 A1    Apr. 21, 2022

Related U.S. Application Data

(62) Division of application No. 16/717,873, filed on Dec. 17, 2019, now Pat. No. 11,217,777.

(30) Foreign Application Priority Data

Apr. 30, 2019 (KR) .................. 10-2019-0050722

(51) Int. Cl.
*H01L 51/52* (2006.01)
*G06F 3/044* (2006.01)
(Continued)

(52) U.S. Cl.
CPC ........... *H10K 50/858* (2023.02); *G06F 3/044* (2013.01); *H10K 50/844* (2023.02); *H10K 59/12* (2023.02); *H10K 59/40* (2023.02)

(58) Field of Classification Search
CPC ......... H01L 27/14621; H01L 27/14625; H01L 27/14627; H01L 27/14623; H01L 27/3211; H01L 27/1464; H04N 5/2254; G02B 5/20; G02B 5/208; G02B 13/0015; G02B 27/0025; G02B 27/1066; G02B 27/123;
(Continued)

(56) References Cited

U.S. PATENT DOCUMENTS 6,072,450 A   6/2000  Yamada et al.
7,535,646 B2  5/2009  Chari et al.
(Continued)

FOREIGN PATENT DOCUMENTS

JP   2009-49135 A   3/2009
JP   2014-52606 A   3/2014
(Continued)

OTHER PUBLICATIONS

EPO Extended Search Report dated Sep. 16, 2020, issued in corresponding European Patent Application No. 20166928.0 (9 pages).

*Primary Examiner* — Dong Hui Liang
(74) *Attorney, Agent, or Firm* — Lewis Roca Rothgerber Christie LLP

(57) ABSTRACT

A display apparatus includes: a display element configured to emit light; a first refractive layer on the display element and having an opening corresponding to the display element; a light extraction pattern located inside the opening of the first refractive layer; and a second refractive layer on the first refractive layer, the second refractive layer covering the first refractive layer and the light extraction pattern.

8 Claims, 20 Drawing Sheets

(51) Int. Cl.
  *H01L 27/32* (2006.01)
  *H10K 50/858* (2023.01)
  *H10K 50/844* (2023.01)
  *H10K 59/12* (2023.01)
  *H10K 59/40* (2023.01)

(58) Field of Classification Search
  CPC ......... G02B 3/0062; G09G 2320/0233; G09G 5/003; G09G 2300/0465; G09G 2300/0408; H10K 50/858; H10K 50/844; H10K 59/12; H10K 59/40
  See application file for complete search history.

(56) References Cited

U.S. PATENT DOCUMENTS

| | | | |
|---|---|---|---|
| 8,410,686 B2 | 4/2013 | Yamada et al. | |
| 8,901,587 B2 | 12/2014 | Ohta | |
| 9,142,802 B2 | 9/2015 | Miyamoto et al. | |
| 9,774,011 B2 | 9/2017 | Choi et al. | |
| 2007/0077349 A1 | 4/2007 | Newman et al. | |
| 2012/0133575 A1* | 5/2012 | Hasegawa | H01L 51/5265 345/76 |
| 2014/0124749 A1 | 5/2014 | Kim et al. | |
| 2014/0339509 A1* | 11/2014 | Choi | H01L 51/5275 257/40 |
| 2014/0361264 A1 | 12/2014 | Choi et al. | |
| 2015/0008399 A1 | 1/2015 | Choi et al. | |
| 2015/0144918 A1 | 5/2015 | Cho et al. | |
| 2015/0333108 A1 | 11/2015 | Miyamoto et al. | |
| 2016/0087245 A1 | 3/2016 | Park et al. | |
| 2016/0283005 A1* | 9/2016 | Lee | G06F 3/0412 |
| 2016/0293894 A1 | 10/2016 | Cheng et al. | |
| 2018/0012940 A1* | 1/2018 | Park | H01L 51/5056 |
| 2018/0138458 A1 | 5/2018 | Tokuda | |
| 2018/0301665 A1 | 10/2018 | Sakamoto | |
| 2018/0374905 A1 | 12/2018 | Choi et al. | |
| 2019/0013495 A1 | 1/2019 | Kim et al. | |
| 2019/0074339 A1 | 3/2019 | Ma et al. | |
| 2019/0221779 A1* | 7/2019 | Jang | H01L 27/323 |

FOREIGN PATENT DOCUMENTS

| | | |
|---|---|---|
| JP | 5523354 B2 | 6/2014 |
| JP | 2015-128027 A | 7/2015 |
| KR | 10-2016-0017397 A | 2/2016 |
| KR | 10-2016-0027608 A | 3/2016 |

\* cited by examiner

DISPLAY APPARATUS

CROSS-REFERENCE TO RELATED APPLICATIONS

This application is a divisional of U.S. patent application Ser. No. 16/717,873, filed Dec. 17, 2019, which claims priority to and the benefit of Korean Patent Application No. 10-2019-0050722, filed Apr. 30, 2019, the entire content of both of which is incorporated herein by reference.

BACKGROUND

1. Field

One or more embodiments relate to a display apparatus, and more particularly, to a display apparatus having excellent luminous efficiency.

2. Description of the Related Art

As the demand for display apparatuses increases, the need for display apparatuses that may be used for various purposes is also increasing. Display apparatuses tend to become larger or thinner, and the need for larger or thinner display apparatuses having accurate and clear colors is also increasing.

SUMMARY

Aspects of embodiments of the present disclosure are directed to a display apparatus for improving the efficiency of light extracted in the display apparatus. However, the above aspects are examples and do not limit the scope of the present disclosure.

Additional aspects will be set forth in part in the description which follows and, in part, will be apparent from the description, or may be learned by practice of the presented embodiments.

According to one or more embodiments, a display apparatus includes: a display element configured to emit light; a first refractive layer on the display element and having an opening corresponding to the display element; a light extraction pattern located inside the opening of the first refractive layer; and a second refractive layer on the first refractive layer, the second refractive layer covering the first refractive layer and the light extraction pattern.

The display element may include: a pixel electrode; an intermediate layer on the pixel electrode and including an emission layer; and a counter electrode on the intermediate layer; wherein the first refractive layer is on an insulating layer covering an edge of the pixel electrode.

The display apparatus may further include an encapsulation member between the display element and the first refractive layer.

The display apparatus may further include an input sensing layer between the encapsulation member and the first refractive layer and including a sensing electrode.

A refractive index of the second refractive layer may be greater than a refractive index of the first refractive layer.

A refractive index of the light extraction pattern may be equal to a refractive index of the first refractive layer.

The light extraction pattern may be located at a center of the opening, and has the same profile as that of the first refractive layer.

The light extraction pattern may have a closed loop shape that is continuous along an edge of the opening.

A plurality of the light extraction patterns may be spaced apart from one another in the opening.

A height of the light extraction pattern may be equal to a height of the first refractive layer.

A height of the light extraction pattern may be less than a height of the first refractive layer.

The display element includes a first display element configured to emit light of a first color and a second display element configured to emit light of a second color, wherein the light extraction pattern located in the opening of the first refractive layer corresponding to the first display element and the light extraction pattern located in the opening of the first refractive layer corresponding to the second display element are different from each other in at least one of a shape, a size, and a number.

According to one or more embodiments, a display apparatus includes: a display element configured to emit light; a first refractive layer on the display element, the first refractive layer having a top surface with a concave surface corresponding to the display element; a light extraction pattern on the concave surface of the first refractive layer; and a second refractive layer on the first refractive layer, the second refractive layer covering the first refractive layer and the light extraction pattern.

The display apparatus may further include an encapsulation member between the display element and the first refractive layer.

The display apparatus may further include an input sensing layer between the encapsulation member and the first refractive layer and including a sensing electrode.

A refractive index of the second refractive layer may be greater than a refractive index of the first refractive layer.

A refractive index of the light extraction pattern may be equal to a refractive index of the first refractive layer.

A height of a top surface of the light extraction pattern and a height of a top surface of a non-concave surface of the first refractive layer may be the same.

A height of a top surface of the light extraction pattern may be less than a height of a top surface of a non-concave surface of the first refractive layer.

The display element may include a first display element configured to emit light of a first color and a second display element configured to emit light of a second color, wherein the light extraction pattern on the concave surface of the first refractive layer corresponding to the first display element and the light extraction pattern on the concave surface of the first refractive layer corresponding to the second display element are different from each other in at least one of a shape, a size, and a number.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
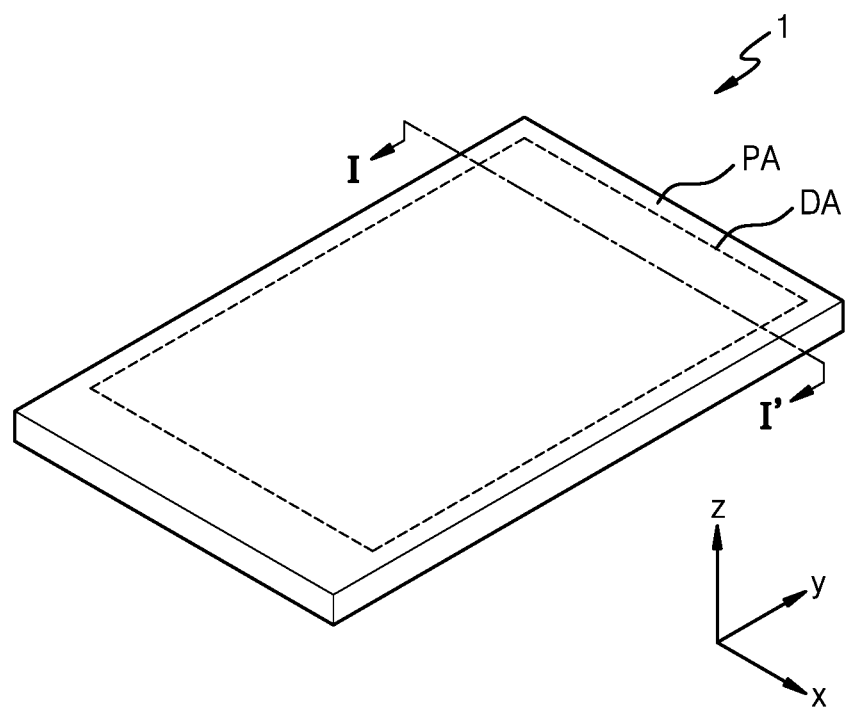
FIG. 1 is a perspective view illustrating a part of a display apparatus according to an embodiment of the present disclosure.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

While various modifications and embodiments of the present disclosure may be made, specific embodiments are shown in the drawings and will herein be described in more detail. The features and effects of the present disclosure and methods of achieving the features and effects will be described more fully with reference to the accompanying drawings, in which embodiments of the present disclosure are shown. However, the present disclosure is not limited to the embodiments described below, and may be embodied in various modes.

The present disclosure will now be described more fully with reference to the accompanying drawings, in which embodiments of the present disclosure are shown. Parts in the drawings unrelated to the detailed description may be omitted to ensure clarity of the present disclosure, like reference numerals in the drawings denote like elements, and thus their description may not be repeated.

It will be understood that when a layer, region, or element is referred to as being "formed on" another layer, region, or element, it may be directly formed on the other layer, region, or element or may be indirectly formed on the other layer, region, or element with intervening layers, regions, or elements therebetween. Sizes of elements may be exaggerated for convenience of explanation. In other words, because sizes and thicknesses of elements in the drawings are arbitrarily illustrated for convenience of explanation, the present disclosure is not limited thereto.

It will be understood that when a layer, region, or element is referred to as being "connected", the layer, region, or element may be directly connected or may be indirectly connected with intervening layers, regions, or elements therebetween. For example, when a layer, region, or element is electrically connected, the layer, region or element may be directly electrically connected or may be indirectly electrically connected with intervening layers, regions, or elements therebetween.

When a certain embodiment may be implemented differently, a specific process order may be different from the described order. For example, two consecutively described processes may be performed substantially at the same time or may be performed in an order opposite to the described order.

It will be understood that although the terms "first", "second", etc. may be used herein to describe various elements, these elements should not be limited by these terms, and these elements are only used to distinguish one element from another. As used herein, the singular forms "a", "an", and "the" are intended to include the plural forms as well, unless the context clearly indicates otherwise. It will be further understood that the terms "comprises" and/or "comprising" used herein specify the presence of stated components, but do not preclude the presence or addition of one or more other components.

As used herein, the term "substantially," "about," and similar terms are used as terms of approximation and not as terms of degree, and are intended to account for the inherent deviations in measured or calculated values that would be recognized by those of ordinary skill in the art.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

In the following embodiments, when a wiring "extends in a first direction or a second direction", it may mean that the wiring extends not only in a linear shape but also in a zigzag or curved shape in the first direction or the second direction.

In the following embodiments, "a plan view of an object" refers to "a view of an object seen from above, and "a cross-sectional view of an object" refers to "a view of an object vertically cut and seen from the side. In the following embodiments, when elements "overlap", it may mean that the elements overlap in a "plan view" and a "cross-sectional view".

In the following embodiments, a signal collectively refers to a voltage or current unless explicitly specified otherwise. In the following embodiments, reference symbol C denotes a capacitor and also denotes capacitance that is a size of a capacitor. Also, a directly generated capacitor and a naturally generated capacitor are all referred to as capacitors without discrimination.

Figure 2:
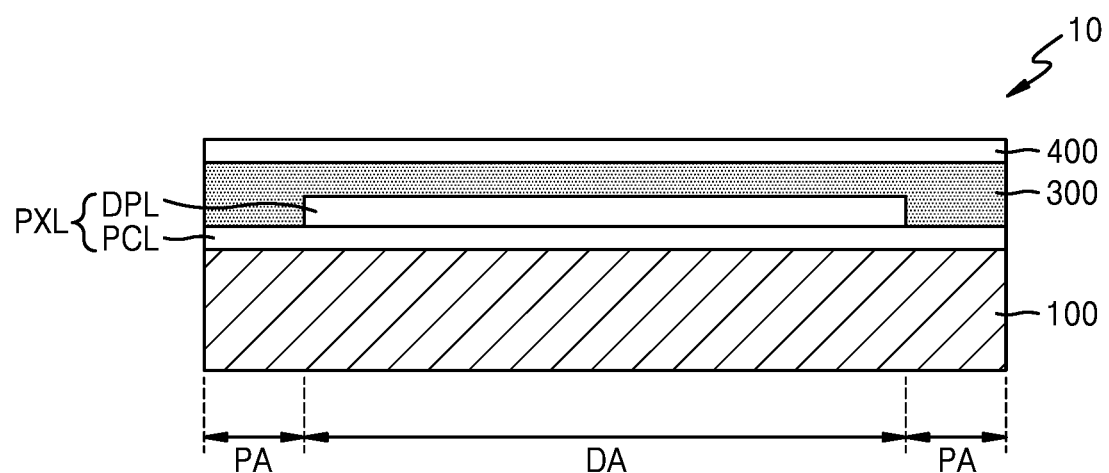
FIG. 2 is a cross-sectional view taken along the line I-I' of FIG. 1.

FIG. 1 is a perspective view illustrating a part of a display apparatus 1 according to an embodiment of the present disclosure. FIG. 2 is a cross-sectional view taken along the line I-I' of FIG. 1.

Referring to FIG. 1, the display apparatus 1 according to an embodiment of the present disclosure may include a display area DA and a peripheral area PA. The peripheral area PA is located outside the display area DA to surround the display area DA. Various wirings and a driving circuit unit for transmitting an electrical signal to be applied to the display area DA may be located in the peripheral area PA. The display apparatus 1 may provide an image (e.g., a predetermined image) by using light emitted from a plurality of pixels located in the display area DA. The peripheral area PA may include a bending area and the display apparatus 1 may be bent at the bending area.

The display apparatus 1 may be an organic light-emitting display, an inorganic light-emitting display (or an inorganic electroluminescent (EL) display), or a quantum dot light-emitting display. The following will be described assuming that the display apparatus 1 is an organic light-emitting display. The display apparatus 1 may be any one or more of various suitable types of electronic devices such as a mobile phone, a notebook, or a smart watch.

As shown in FIG. 2, the display apparatus 1 includes a display panel 10 including a substrate 100 and an encapsulation member 300 for sealing the substrate 100. The substrate 100 and the encapsulation member 300 are sequentially stacked in a third direction (e.g., a z-direction).

The substrate 100 may include a glass material or a polymer resin. For example, the substrate 100 may include a glass material including $SiO_2$ as a main component, or any one or more of various suitable flexible or bendable materials such as a resin (e.g., reinforced plastic). The peripheral area PA may include a bending area and the substrate 100 may be bent at the bending area.

A pixel layer PXL may be located on the substrate 100. The pixel layer PXL may include a display element layer DPL including display elements located for each pixel and a pixel circuit layer PCL including a pixel circuit and insulating layers located for each pixel. The display element layer DPL may be located on the pixel circuit layer PCL, and a plurality of insulating layers may be located between a pixel circuit and a display element. Some wirings and insulating layers of the pixel circuit layer PCL may extend to the peripheral area PA.

The encapsulation member 300 may be a thin-film encapsulation layer. The thin-film encapsulation layer may include at least one inorganic encapsulation layer and at least one organic encapsulation layer. When the display apparatus 1 includes the substrate 100 including a polymer resin and the encapsulation member 300 that is a thin-film encapsulation layer including an inorganic encapsulation layer and an organic encapsulation layer, the flexibility of the display apparatus 1 may be improved.

The display panel 10 may include a refractive layer 400 located on the encapsulation member 300. The refractive layer 400 may adjust a path of light emitted by a display element of the display element layer DPL and may function as a lens. The refractive layer 400 may improve light extraction efficiency at a front surface of the display apparatus 1 by changing a path of light emitted by a display element, and may improve color shift of light emitted to the front surface and light emitted to a side surface.

The display apparatus 1 may further include a polarizer, a window, etc. on the encapsulation member 300 or on the refractive layer 400. For example, the refractive layer 400 may be provided between the encapsulation member 300 and the polarizer or between the encapsulation member 300 and the window.

Figure 3:
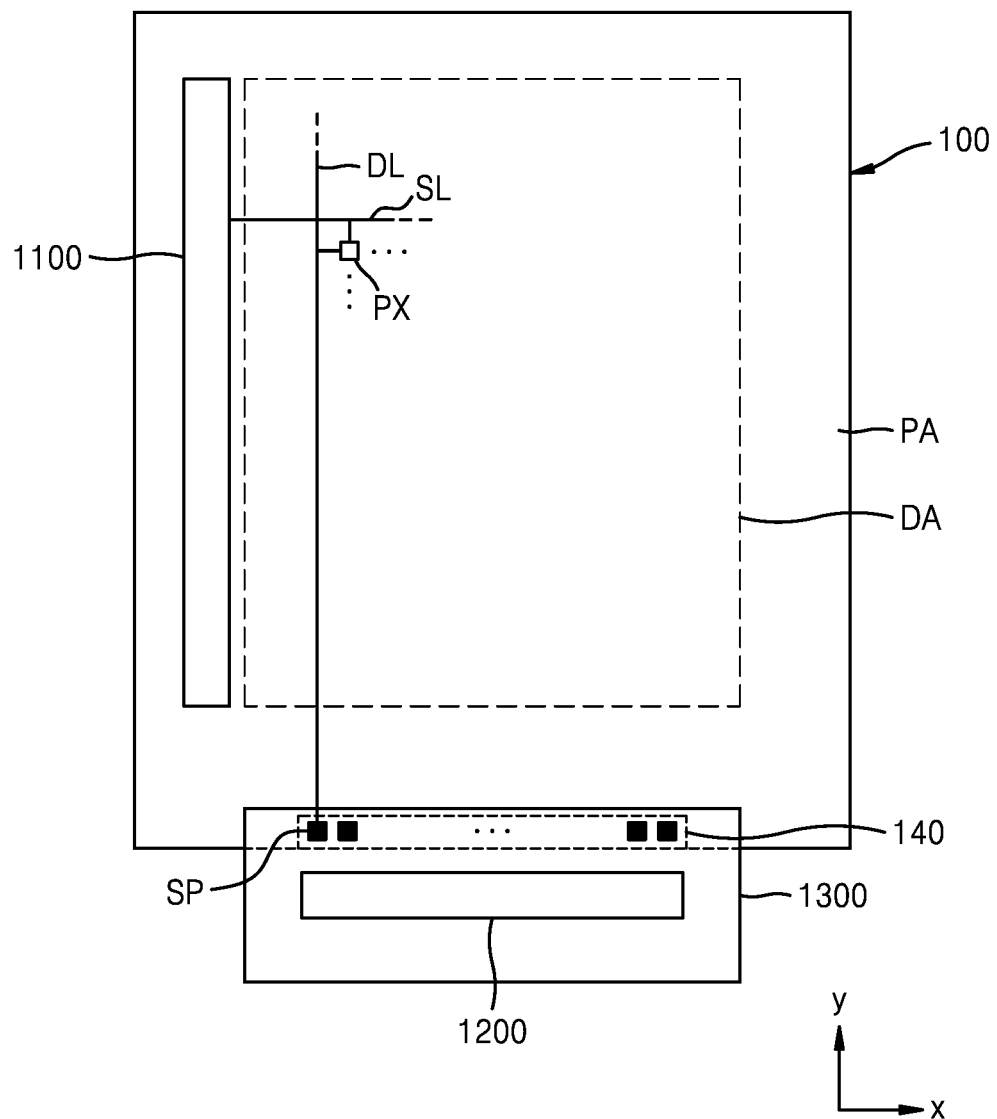
FIG. 3 is a view illustrating a part of a display panel according to an embodiment of the present disclosure.
Figure 4A:
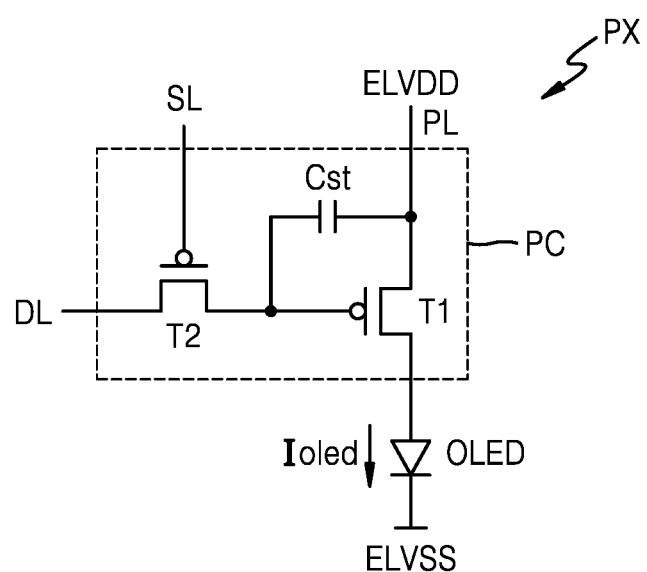
FIGS. 4A and 4B are views illustrating a pixel according to an embodiment of the present disclosure.
Figure 4B:
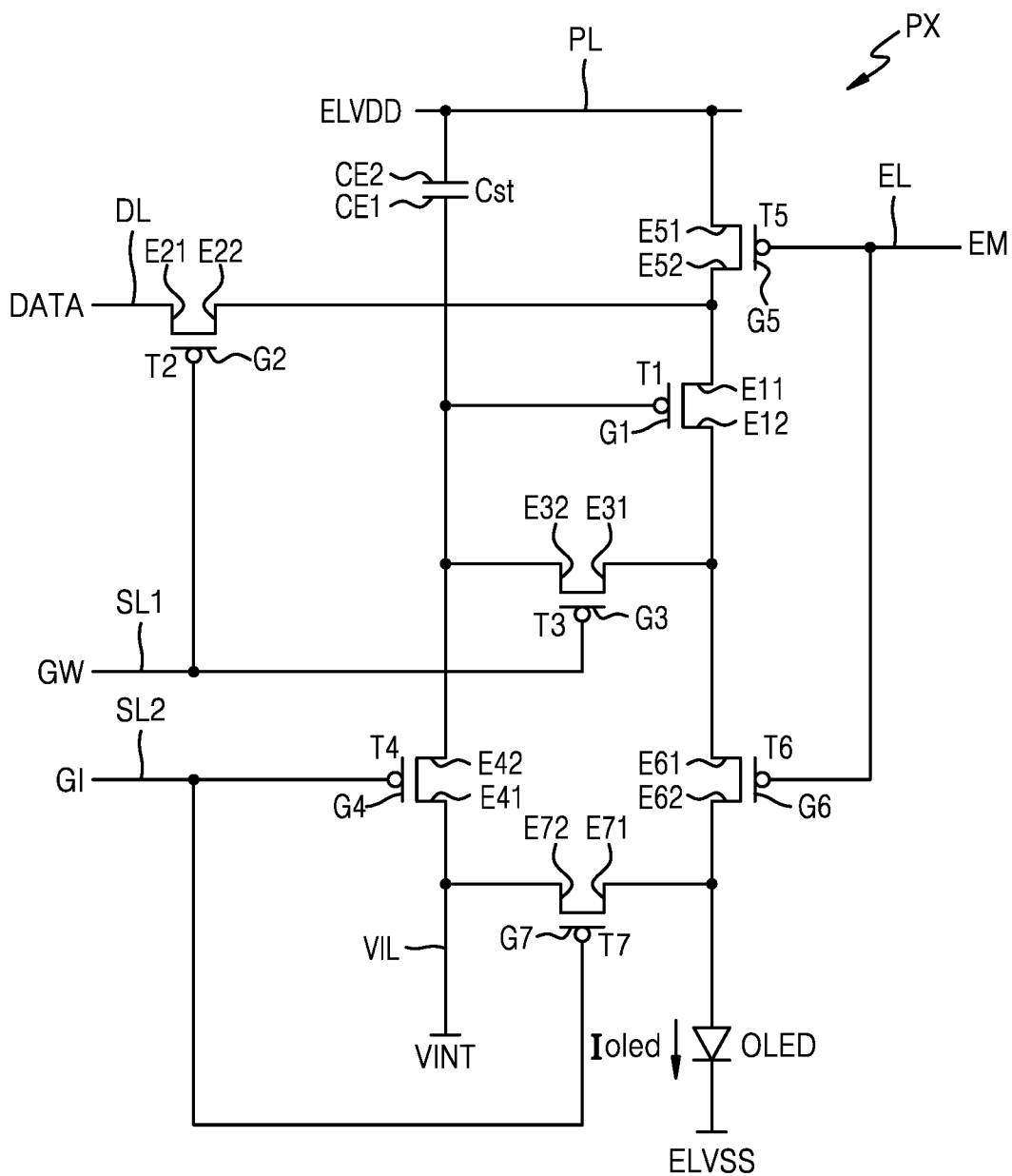

FIG. 3 is a view illustrating a part of a display panel according to an embodiment of the present disclosure. FIGS. 4A and 4B are views illustrating a pixel according to an embodiment of the present disclosure.

Referring to FIG. 3, the substrate 100 may include the display area DA and the peripheral area PA. The peripheral area PA may be located outside the display area DA and may surround the display area DA.

A plurality of pixels PX that are arranged in a pattern (e.g., a predetermined pattern) in a first direction (e.g., an x-direction or a row direction) and a second direction (e.g., a y-direction or a column direction) may be provided on the substrate 100 in the display area DA.

A scan driver 1100 for applying a scan signal to each pixel PX, a data driver 1200 for applying a data signal to each pixel PX, and main power supply wirings for applying a first power supply voltage (ELVDD, see FIGS. 4A and 4B) and a second power supply voltage (ELVSS, see FIGS. 4A and 4B) may be located on the substrate 100 in the peripheral area PA. A pad unit 140 may be located on the substrate 100 in the peripheral area PA. The pad unit 140 includes a plurality of signal pads SP where each signal pad SP is connected to a data line DL (e.g., a corresponding data line DL).

The scan driver 1100 may include an oxide semiconductor thin-film transistor (TFT) gate driver circuit (OSG) or an amorphous silicon TFT gate driver circuit (ASG). Although the scan driver 1100 is located adjacent to a side of the substrate 100 in FIG. 3, the scan driver 1100 may be located adjacent to two sides (e.g., two opposite sides) of the substrate 100 according to an embodiment.

In FIG. 3, the data driver 1200 is located on a film 1300 electrically connected to the signal pads SP located on the substrate 100 by using a chip on film (COF) method. According to an embodiment, the data driver 1200 may be directly located on the substrate 100 by using a chip on glass (COG) method or a chip on plastic (COP) method. The data driver 1200 may be electrically connected to a flexible printed circuit board (FPCB).

Referring to FIG. 4A, the pixel PX includes a pixel circuit PC connected to a scan line SL and the data line DL and a display element connected to the pixel circuit PC. The pixel circuit PC may include a transistor and a capacitor, and the display element may include an organic light-emitting diode (OLED).

The pixel circuit PC may include a first transistor T1, a second transistor T2, and a capacitor Cst. Each pixel PX may emit, for example, red, green, blue, or white light, through the OLED. Each of the first transistor T1 and the second transistor T2 may be a thin-film transistor.

The second transistor T2 that is a switching transistor may be connected to the scan line SL and the data line DL. The second transistor T2 may transmit a data signal input from the data line DL to the first transistor T1 according to a scan signal input from the scan line SL. The capacitor Cst may be connected to the second transistor T2 and a power supply line PL, and may store a voltage corresponding to a difference between a voltage corresponding to a data signal received from the second transistor T2 and the first power supply voltage ELVDD supplied to the power supply line PL.

The first transistor T1 that is a driving transistor may be connected to the power supply line PL and the capacitor Cst. The first transistor T1 may control driving current Ioled flowing through the OLED from the power supply line PL according to a value of the voltage stored in the capacitor Cst.

The OLED may emit light having a predetermined (or set) luminance due to the driving current Ioled. The OLED may include a pixel electrode, a counter electrode, and an emission layer located between the pixel electrode and the counter electrode. The counter electrode of the OLED may receive the second power supply voltage ELVSS.

Although the pixel circuit PC includes two transistors and one capacitor in FIG. 4A, the present disclosure is not limited thereto. The number of transistors and the number of capacitors may be modified in various suitable ways according to the design of the pixel circuit PC.

Referring to FIG. 4B, a plurality of signal lines (e.g., a first scan line SL1, a second scan line SL2, an emission control line EL, and the data line DL), an initialization voltage line VIL, and the power supply voltage line PL are provided for each pixel PX. In an embodiment, at least one of the first scan line SL1, the second scan line SL2, the emission control line EL, the data line DL, the initialization voltage line VIL, and/or the power supply voltage line PL may be shared by adjacent pixels.

Signal lines include the first scan line SL1 that transmits a first scan signal GW, the second scan line SL2 that transmits a second scan signal GI, the emission control line EL that transmits an emission control signal EM, and the data line DL that crosses the first scan line SL1 and transmits a data signal DATA. The second scan line SL2 may be connected to the first scan line SL1 of a next row or a previous row, and the second scan signal GI may be the first scan signal GW of the next row or the previous row.

The power supply voltage line PL applies the first power supply voltage ELVDD to the first transistor T1, and the initialization voltage line VIL applies an initialization voltage VINT for initializing the first transistor T1 and a pixel electrode to the pixel PX.

A pixel circuit of the pixel PX may include a plurality of transistors (e.g., first through seventh transistors T1 through T7), and the capacitor Cst. First electrodes E11 through E71 and second electrodes E12 through E72 of FIG. 4B may be source electrodes (source regions) or drain electrodes (drain regions) according to a type (e.g., a p-type or an n-type) of a transistor and/or an operation condition. The first through seventh transistors T1 through T7 may be TFTs.

The first transistor T1 includes a gate electrode G1 connected to a lower electrode CE1 of the capacitor Cst, the first electrode E11 connected to the power supply voltage line PL through the fifth transistor T5, and the second electrode E12 electrically connected to the pixel electrode of the OLED through the sixth transistor T6. The first transistor T1 functions as a driving transistor, and receives the data signal DATA according to a switching operation of the second transistor T2 and supplies current to the OLED.

The second transistor T2 includes a gate electrode G2 connected to the first scan line SL1, a first electrode E21 connected to the data line DL, and a second electrode E22 connected to the first electrode E11 of the first transistor T1. The second transistor T2 is turned on according to the first scan signal GW received through the first scan line SL1 and performs a switching operation of transmitting the data signal DATA transmitted to the data line DL to the first electrode E11 of the first transistor T1.

The third transistor T3 includes a gate electrode G3 connected to the first scan line SL1, the first electrode E31 connected to the second electrode E12 of the first transistor T1, and the second electrode E32 connected to the lower electrode CE1 of the capacitor Cst, the second electrode E42 of the fourth transistor T4 and the gate electrode G1 of the first transistor T1. The first electrode E31 is connected to the pixel electrode of the OLED through the sixth transistor T6. The third transistor T3 is turned on according to the first scan signal GW received through the first scan line SL1 and diode-connects the first transistor T1.

The fourth transistor T4 includes a gate electrode G4 connected to the second scan line SL2, the first electrode E41 connected to the initialization voltage line VIL, and the second electrode E42 connected to the lower electrode CE1 of the capacitor Cst, the second electrode E32 of the third transistor T3 and the gate electrode G1 of the first transistor T1. The fourth transistor T4 is turned on according to the second scan signal GI received through the second scan line SL2 and initializes a gate voltage of the first transistor T1 by transmitting the initialization voltage VINT to the gate electrode G1 of the first transistor T1.

The fifth transistor T5 includes a gate electrode G5 connected to the emission control line EL, the first electrode E51 connected to the power supply voltage line PL, and the second electrode E52 connected to the first electrode E11 of the first transistor T1 and the second electrode E22 of the second transistor T2.

The sixth transistor T6 includes a gate electrode G6 connected to the emission control line EL, the first electrode E61 connected to the second electrode E12 of the first transistor T1 and the first electrode E31 of the third transistor T3, and the second electrode E62 connected to the pixel electrode of the OLED.

The fifth transistor T5 and the sixth transistor T6 are concurrently (e.g., simultaneously) turned on according to the emission control signal EM received through the emission control line EL so that current flows through the OLED.

The seventh transistor T7 includes a gate electrode G7 connected to the second scan line SL2, the first electrode E71 connected to the second electrode E62 of the sixth transistor T6 and the pixel electrode of the OLED, and the second electrode E72 connected to the initialization voltage line VIL. The seventh transistor T7 is turned on according to the second scan signal GI received through the second scan line SL2 and initializes a voltage of the pixel electrode of the OLED. In an embodiment, the seventh transistor T7 may be omitted.

Although the fourth transistor T4 and the seventh transistor T7 are connected to the second scan line SL2 in FIG. 4B, the present disclosure is not limited thereto. In an embodiment, the fourth transistor T4 is connected to the second scan line SL2 and the seventh transistor T7 is connected to other wiring and may operate according to a signal transmitted to the wiring.

The capacitor Cst includes the lower electrode CE1 connected to the gate electrode G1 of the first transistor T1 and an upper electrode CE2 connected to the power supply voltage line PL. The lower electrode CE1 of the capacitor Cst is also connected to the second electrode E32 of the third transistor T3 and the second electrode E42 of the fourth transistor T4.

The OLED includes the pixel electrode, a counter electrode, and an emission layer located between the pixel electrode and the counter electrode. The counter electrode may receive the second power supply voltage ELVSS. The OLED displays an image by receiving the driving current Ioled from the first transistor T1 and emitting light.

Figure 5:
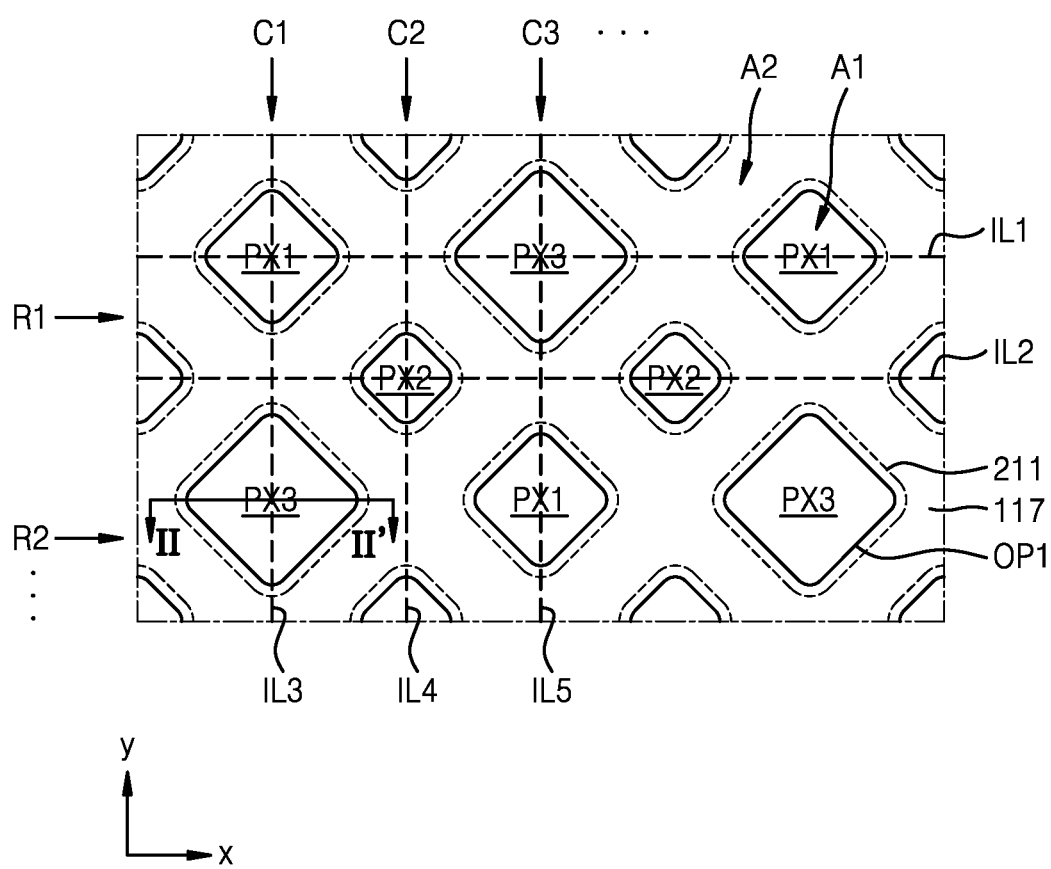
FIG. 5 is a partial plan view illustrating an arrangement of pixels according to an embodiment of the present disclosure.
Figure 6:
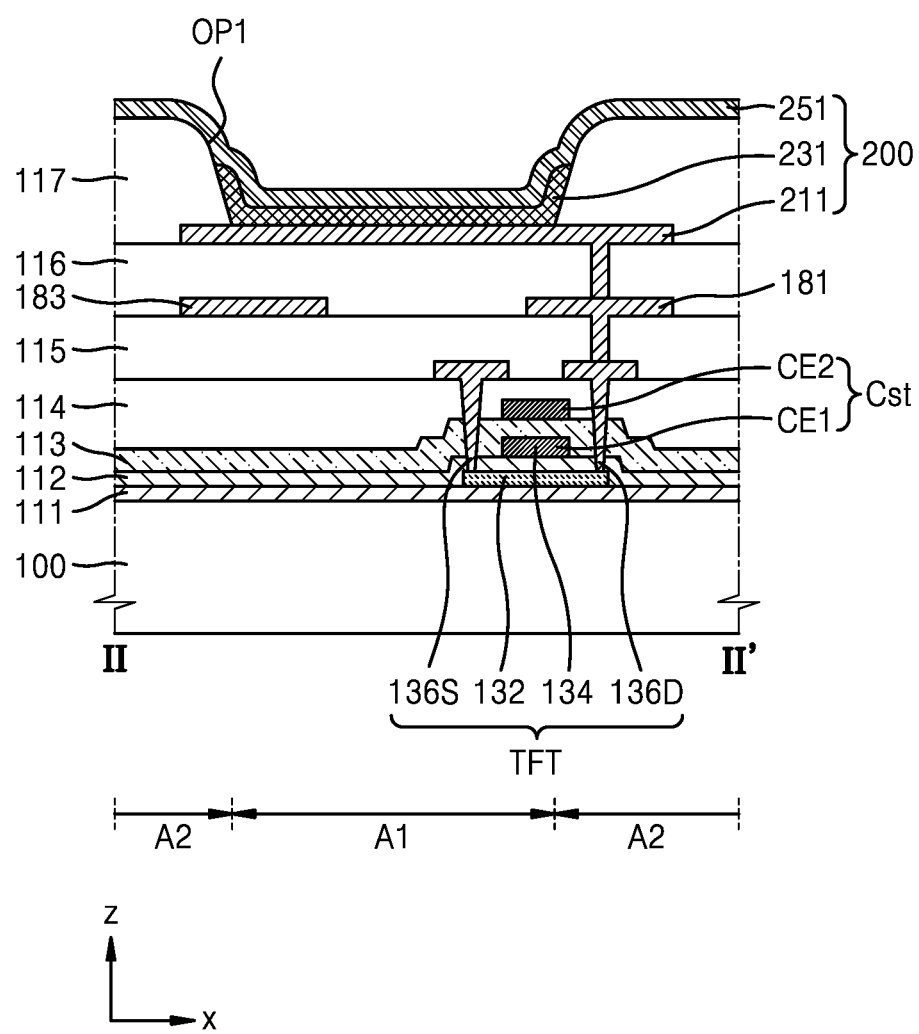
FIG. 6 is a cross-sectional view taken along the line II-II' of FIG. 5.

FIG. 5 is a partial plan view illustrating an arrangement of pixels according to an embodiment of the present disclosure. FIG. 6 is a cross-sectional view taken along the line II-II' of FIG. 5.

A plurality of pixels located in the display area DA may include a first pixel PX1, a second pixel PX2, and a third pixel PX3. The first pixel PX1, the second pixel PX2, and the third pixel PX3 may be repeatedly arranged in a pattern (e.g., a predetermined pattern) in rows and columns. Each of the first pixel PX1, the second pixel PX2, and the third pixel PX3 may include a pixel circuit and the OLED electrically connected to the pixel circuit. The OLED of each pixel may be directly located on the pixel circuit to overlap the pixel circuit, or may be offset from the pixel circuit to overlap the pixel circuit of a pixel of an adjacent row or column. An arrangement of pixels may be an arrangement of the OLEDs of the first pixel PX1, the second pixel PX2, and the third pixel PX3 or an arrangement of pixel electrodes 211 of the OLEDs.

In each of rows R1, R2, . . . , the pixel electrode 211 of the first pixel PX1, the pixel electrode 211 of the second pixel PX2, and the pixel electrode 211 of the third pixel PX3 may be spaced apart from one another and may be alternately arranged in a zigzag pattern. The pixel electrode 211 of the first pixel PX1 and the pixel electrode 211 of the third pixel PX3 may be spaced apart from each other and may be alternately arranged on a first imaginary straight line IL1 in the first direction (e.g., the x-direction). The pixel electrode 211 of the second pixel PX2 may be offset in a direction between the first direction (e.g., the x-direction) and the second direction (e.g., the y-direction) from the pixel electrode 211 of the first pixel PX1 and the pixel electrode 211 of the third pixel PX3. In other words, the pixel electrode 211 of the second pixel PX2 may be offset from the pixel electrode 211 of the first pixel PX1 and the pixel electrode 211 of the third pixel PX3 in the x-direction and the y-direction. The pixel electrode 211 of the second pixel PX2 may be repeatedly arranged on a second imaginary straight line IL2 in the first direction (e.g., the x-direction).

In a first column C1, the pixel electrode 211 of the first pixel PX1 and the pixel electrode 211 of the third pixel PX3 may be spaced apart from each other and may be alternately arranged on a third imaginary straight line IL3 in the second direction (e.g., the y-direction). In a second column C2 adjacent to the first column C1, the pixel electrodes 211 of the second pixels PX2 may be spaced apart from each other and may be repeatedly arranged on a fourth imaginary straight line IL4 in the second direction (e.g., the y-direction). In a third column C3 adjacent to the second column C2, the pixel electrode 211 of the third pixel PX3 and the pixel electrode 211 of the first pixel PX1 may be spaced apart from each other in an opposite arrangement to the first column C1 and may be alternately arranged on a fifth imaginary straight line IL5 in the second direction (e.g., the y-direction).

The pixel electrode 211 of the first pixel PX1, the pixel electrode 211 of the second pixel PX2, and the pixel electrode 211 of the third pixel PX3 may have different areas from each other. In an embodiment, the pixel electrode 211 of the third pixel PX3 may have a larger area than that of the pixel electrode 211 of the first pixel PX1 that is adjacent to the third pixel PX3. Also, the pixel electrode 211 of the third pixel PX3 may have a larger area than that of the pixel electrode 211 of the second pixel PX2 that is adjacent to the third pixel PX3. The pixel electrode 211 of the first pixel PX1 may have a larger area than that of the pixel electrode 211 of the second pixel PX2 that is adjacent to the first pixel PX1. In an embodiment, the pixel electrode 211 of the third pixel PX3 may have the same area as that of the pixel electrode 211 of the first pixel PX1. The pixel electrode 211 may have a polygonal shape such as a quadrangular shape or an octagonal shape, a circular shape, or an elliptical shape, and the polygonal shape may include a shape having round vertices.

In an embodiment, the first pixel PX1 may be a red pixel that emits red light, the second pixel PX2 is a blue pixel that emits blue light, and the third pixel PX3 is a green pixel that emits green light. In an embodiment, the first pixel PX1 may be a red pixel, the second pixel PX2 may be a green pixel, and the third pixel PX3 may be a blue pixel.

The display area DA of the substrate 100 may include a first area A1 and a second area A2 around the first area A1. The first area A1 may be an area where the OLED of each of the first pixel PX1, the second pixel PX2, and the third pixel PX3 is located. The pixel electrode 211 may be located in the first area A1, and the area of the first area A1 may be less than the area of the pixel electrode 211. The second area A2 (e.g., a portion of the second area A2) surrounding the first area A1 is located between a plurality of the first areas A1. A third insulating layer 117 may be located in the second area A2. The first area A1 corresponds to a portion of the pixel electrode 211 that is exposed through a first opening OP1 of the third insulating layer 117, and the second area A2 corresponds to a portion where the third insulating layer 117 is located between the pixel electrodes 211. Accordingly, the first area A1 and the second area A2 of the substrate 100 may correspond to the first area A1 and the second area A2 of the pixel PX. The first area A1 is defined as an area corresponding to a bottom surface of the first opening OP1 having a minimum area when the first opening OP1 is seen from above. In FIG. 5, an outline of the bottom surface of the first opening OP1 is marked by a solid line and an outline of the pixel electrode 211 is marked by a dashed line.

Referring to FIG. 6, a buffer layer 111 formed to prevent or reduce penetration of impurities into a semiconductor layer of a TFT may be located on the substrate 100.

The substrate 100 may be formed of any of various suitable materials such as a glass material, a metal material, or a plastic material. According to an embodiment, the substrate 100 may be a flexible substrate, and may include a polymer resin such as polyethersulfone (PES), polyarylate (PAR), polyetherimide (PEI), polyethylene naphthalate (PEN), polyethylene terephthalate (PET), polyphenylene sulfide (PPS), polyimide (PI), polycarbonate (PC), or cellulose acetate propionate (CAP).

The buffer layer 111 may include an inorganic insulating material such as silicon nitride or silicon oxide, and may have a single-layer or multi-layer structure.

A TFT, the capacitor Cst, and an OLED 200 electrically connected to the TFT may be located on the substrate 100. When the OLED 200 is electrically connected to the TFT, it may refer to the electrical connection between the pixel electrode 211 and the TFT (i.e., the pixel electrode 211 is electrically connected to the TFT). The TFT may be the first transistor T1 of FIGS. 4A and 4B.

The TFT may include a semiconductor layer 132, a gate electrode 134, a source electrode 136S, and a drain electrode 136D. The semiconductor layer 132 may include an oxide semiconductor material. The semiconductor layer 132 may include amorphous silicon, polysilicon, or an organic semiconductor material. The gate electrode 134 may have a single-layer or multi-layer structure including at least one of, for example, aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), in consideration of properties such as adhesion with an adjacent layer, surface flatness of a stacked layer, and processability.

A gate insulating layer 112 including an inorganic material such as silicon oxide, silicon nitride, and/or silicon oxynitride may be located between the semiconductor layer 132 and the gate electrode 134. A first interlayer insulating layer 113 and a second interlayer insulating layer 114 including an inorganic material such as silicon oxide, silicon nitride, and/or silicon oxynitride may be located between the gate electrode 134 and the source electrode 136S and the drain electrode 136D. The source electrode 136S and the drain electrode 136D may be connected to the semiconductor layer 132 through contact holes formed in the gate insulating layer 112, the first interlayer insulating layer 113, and the second interlayer insulating layer 114.

Each of the source electrode 136S and the drain electrode 136D may have a single-layer or multi-layer structure including at least one of Al, Pt, Pd, Ag, Mg, Au, Ni, Nd, Ir, Cr, Li, Ca, Mo, Ti, W, and Cu.

The capacitor Cst includes the lower electrode CE1 and the upper electrode CE2 overlapping each other with the first interlayer insulating layer 113 therebetween. The capacitor Cst may overlap the TFT. In FIG. 6, the gate electrode 134 of the TFT is the lower electrode CE1 of the capacitor Cst. In an embodiment, the capacitor Cst may not overlap the TFT. The capacitor Cst may be covered by the second interlayer insulating layer 114.

A pixel circuit including the TFT and the capacitor Cst may be covered by a first insulating layer 115 and a second insulating layer 116. The first insulating layer 115 and the second insulating layer 116 may be organic insulating layers that are planarization insulating layers. Each of the first insulating layer 115 and the second insulating layer 116 may include an organic insulating material such as a general-purpose polymer (e.g., polymethyl methacrylate (PMMA) or polystyrene (PS)), a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof. In an embodiment, each of the first insulating layer 115 and the second insulating layer 116 may include PI.

A display element, for example, the OLED 200, may be located on the second insulating layer 116. The OLED 200 may include the pixel electrode 211, an intermediate layer 231, and a counter electrode 251.

The pixel electrode 211 may be located on the second insulating layer 116, and may be connected to the TFT through a connection electrode 181 on the first insulating layer 115. A wiring 183 such as the data line DL or the power supply line PL may be located on the first insulating layer 115.

The pixel electrode 211 may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). In an embodiment, the pixel electrode 211 may include a reflective film including Ag, Mg, Al, Pt, Pd, Au, Ni, Nd, Ir, Cr, or a compound thereof. In an embodiment, the pixel electrode 211 may further include a film formed of ITO, IZO, ZnO, or $In_2O_3$ over/under the reflective film.

A third insulating layer 117 may be located on the second insulating layer 116. The third insulating layer 117 may cover an edge of the pixel electrode 211, and may be a pixel-defining film that defines a pixel by having the first opening OP1 through which a part of the pixel electrode 211 is exposed. The first opening OP1 may correspond to the first area A1. The third insulating layer 117 may increase a distance between the edge of the pixel electrode 211 and the counter electrode 251, thereby preventing or substantially preventing an arc or the like from occurring at the edge of the pixel electrode 211. The third insulating layer 117 may be formed of an organic material such as PI or hexamethyldisiloxane (HMDSO).

The intermediate layer 231 includes an emission layer. The emission layer may include a high molecular weight material or a low molecular weight material that emits light of a predetermined (or set) color. In an embodiment, the intermediate layer 231 may include a first functional layer located under the emission layer and/or a second functional layer located over the emission layer. The first functional layer and/or the second functional layer may include a layer integrated over the plurality of pixel electrodes 211, or may include a layer pattern corresponding to each of the plurality of pixel electrodes 211.

The first functional layer may have a single-layer or multi-layer structure. For example, when the first functional layer is formed of a high molecular weight material, the first functional layer may include a hole transport layer (HTL) that has a single-layer structure and is formed of poly-(3, 4)-ethylene-dihydroxy thiophene (PEDOT) or polyaniline (PANI). When the first functional layer is formed of a low molecular weight material, the first functional layer may include a hole injection layer (HIL) and a hole transport layer (HTL).

In an embodiment, the second functional layer may be omitted. For example, when each of the first functional layer and the emission layer is formed of a high molecular weight material, it is preferable to form the second functional layer in order to improve characteristics of the OLED 200. The second functional layer may have a single-layer or multi-layer structure. The second functional layer may include an electron transport layer (ETL) and/or an electron injection layer (EIL).

The counter electrode 251 faces the pixel electrode 211 with the intermediate layer 231 therebetween. The counter electrode 251 may be formed of a conductive material having a low work function. For example, the counter electrode 251 may include a (semi)transparent layer including Ag, Mg, Al, Pt, Pd, Au, Ni, Nd, Ir, Cr, Li, or Ca, or an alloy thereof. Alternatively, the counter electrode 251 may further include a layer formed of ITO, IZO, ZnO, or $In_2O_3$ on the (semi)transparent layer including the above material.

The counter electrode 251 may be located on the intermediate layer 231 and the third insulating layer 117. The counter electrode 251 may be integrally formed with the plurality of OLEDs 200 in the display area DA to face the plurality of pixel electrodes 211.

Figure 7:
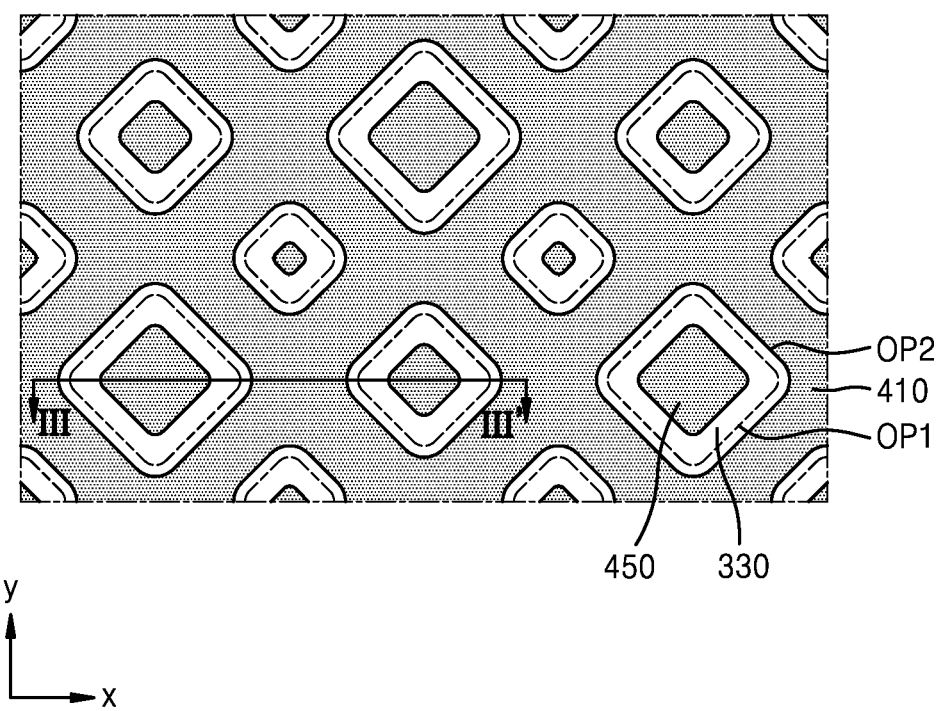
FIG. 7 is a partial plan view illustrating a refractive layer according to an embodiment of the present disclosure.
Figure 8:
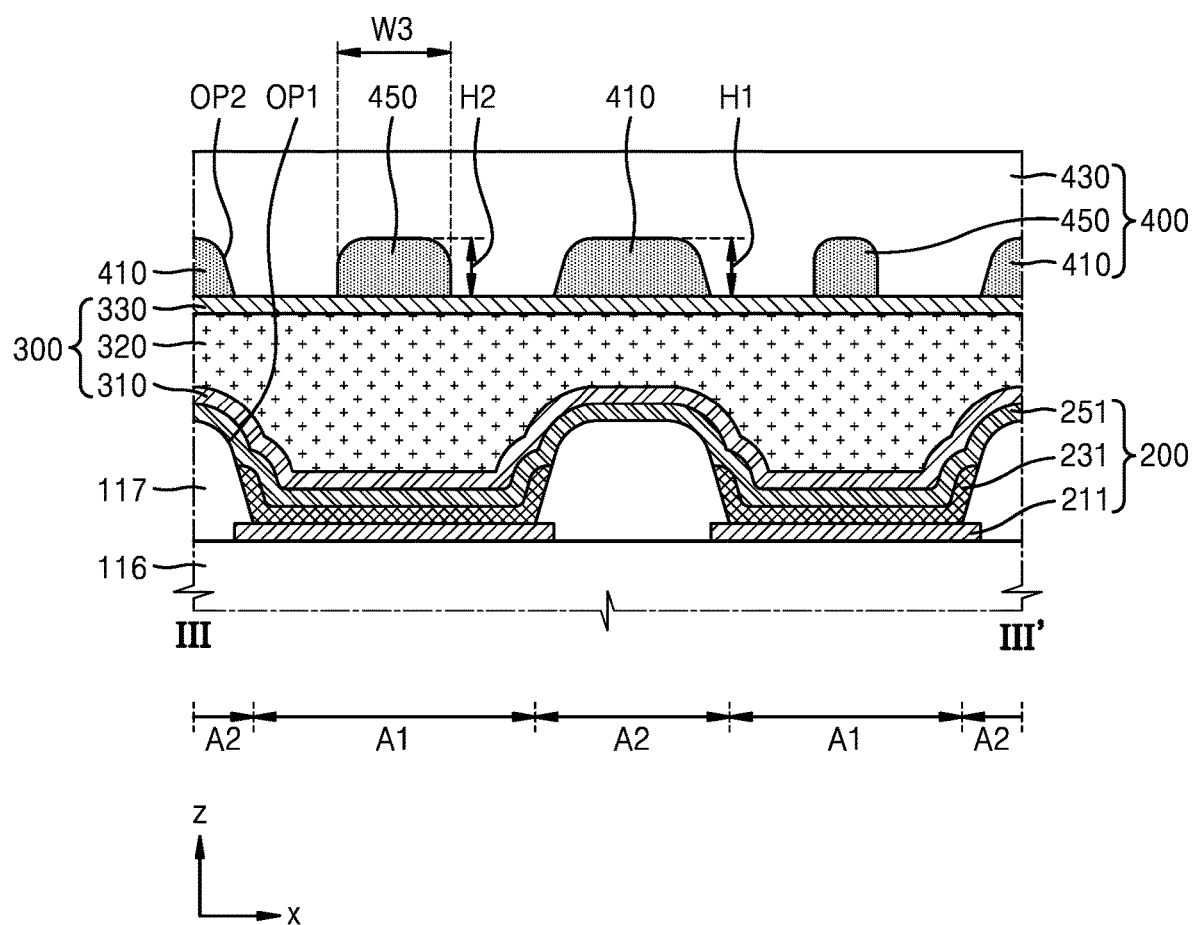
FIG. 8 is a cross-sectional view taken along the line III-Ill' of FIG. 7.

FIG. 7 is a partial plan view illustrating a refractive layer according to an embodiment of the present disclosure. FIG. 8 is a cross-sectional view taken along the line III-Ill' of FIG. 7. The same elements as those of FIGS. 5 and 6 may not be described.

Referring to FIGS. 7 and 8, a thin-film encapsulation layer may be located as the encapsulation member 300 on the counter electrode 251. The thin-film encapsulation layer protects the OLED 200 from external moisture or oxygen. The thin-film encapsulation layer may have a multi-layer structure. The thin-film encapsulation layer may include a first inorganic layer 310, an organic layer 320, and a second inorganic layer 330. Because the thin-film encapsulation layer has a multi-layer structure, even when cracks occur in the thin-film encapsulation layer, the cracks may be prevented or substantially prevented from connecting to one another between the first inorganic layer 310 and the organic layer 320 or between the organic layer 320 and the second inorganic layer 330. Accordingly, the formation of a path through which external moisture or oxygen penetrates into the display area DA may be prevented or minimized. In an embodiment, the number of organic layers, the number of inorganic layers, and an order in which organic layers and inorganic layers are stacked may be modified.

The first inorganic layer 310 may cover the counter electrode 251 and may include at least one inorganic insulating layer of aluminum oxide, titanium oxide, tantalum oxide, hafnium oxide, zinc oxide, silicon oxide, silicon nitride, and silicon oxynitride. Because the first inorganic layer 310 is formed along a structure located under the first inorganic layer 310, a top surface of the first inorganic layer 310 may not be flat.

The organic layer 320 may cover the first inorganic layer 310 and may have a sufficient thickness. A top surface of the organic layer 320 may be substantially flat over the display area DA. The organic layer 320 may include PET, PEN, PC, PI, polyethylene sulfonate, polyoxymethylene, polyarylate, HMDSO, or an acrylic resin (e.g., PMMA or polyacrylic acid), or a combination thereof.

The second inorganic layer 330 may cover the organic layer 320, and may include at least one inorganic insulating material from among aluminum oxide, titanium oxide, tantalum oxide, hafnium oxide, zinc oxide, silicon oxide, silicon nitride, and silicon oxynitride. The second inorganic layer 330 may extend to the outside of the organic layer 320 and may contact the first inorganic layer 310 in the peripheral area PA, thereby preventing or substantially preventing the organic layer 320 from being exposed to the outside.

Structures located under the thin-film encapsulation layer may be damaged when the thin-film encapsulation layer is formed. For example, when the first inorganic layer 310 is formed, a layer directly under the first inorganic layer 310 may be damaged. Accordingly, in order to prevent or reduce damage to a lower structure when the thin-film encapsulation layer is formed, at least one capping layer and/or protective layer may be located between the counter electrode 251 and the thin-film encapsulation layer. The protective layer may include an inorganic material.

A refractive layer 400 may be located on the OLED 200, for example, on the encapsulation member 300. The refractive layer 400 may adjust a path of light emitted by the emission layer of the OLED 200 and may function as a condenser lens. The refractive layer 400 may change a path of light traveling in a lateral direction (e.g., a direction other than the third direction (e.g., the z-direction)) from among light emitted by the emission layer of the OLED 200 so that the light travels substantially forward in the third direction (e.g., the z-direction). The refractive layer 400 may include a first refractive layer 410 and a second refractive layer 430.

The first refractive layer 410 may be located to correspond to the second area A2 of the substrate 100, and may have a second opening OP2 through which a top surface of the encapsulation member 300 corresponding to the first area A1 is exposed. That is, the first refractive layer 410 may be formed in a lattice pattern with a plurality of the second openings OP2. Each of the second openings OP2 of the first refractive layer 410 may be formed by patterning a first refractive layer forming material on the encapsulation member 300 by using a photoetching process. In FIG. 7, an outline of a bottom surface of the second opening OP2 is marked by a solid line, and an outline of a bottom surface of the first opening OP1 is marked by a dashed line. The second opening OP2 of the first refractive layer 410 may surround the first opening OP1 of the third insulating layer 117 and may overlap the first opening OP1 of the third insulating layer 117. The second opening OP2 of the first refractive layer 410 may be equal to or greater in size than the first opening OP1 of the third insulating layer 117. A shape of the second opening OP2 of the first refractive layer 410 may be the same as the shape of the first opening OP1 of the third insulating layer 117. Although the second opening OP2 has a quadrangular shape in FIG. 7, in an embodiment, the second opening OP2 may have a circular shape, an elliptical shape, or a polygonal shape such as a triangular shape. The polygonal shape may have a shape having round corners.

The first refractive layer 410 may have a first refractive index, for example, a refractive index of about 1.4 to about 1.5. The first refractive layer 410 may include a light-transmitting inorganic material or organic material having a low refractive index. For example, the inorganic material may include silicon oxide or magnesium fluoride. The organic material may include at least one selected from the group consisting of PI, polyimide, and tris(8-hydroxyquinolinato)aluminum (Alq3).

The second refractive layer 430 may fill the second opening OP2 of the first refractive layer 410 and may be located on the first refractive layer 410. The second refractive layer 430 may cover an entire surface of the substrate 100, and a top surface of the second refractive layer 430 may be substantially flat. The second refractive layer 430 may have a second refractive index higher (or greater) than the first refractive index of the first refractive layer 410. For example, the second refractive layer 430 may have a refractive index of about 1.6 or more, and specifically, a refractive index of 1.6 to 1.8. In an embodiment, the first refractive layer 410 and the second refractive layer 430 may have a refractive index difference of 0.1 to 0.3. The second refractive layer 430 may include a light-transmitting inorganic material or organic material having a high refractive index. For example, the inorganic material may include zinc oxide, titanium oxide, zirconium oxide, niobium oxide, tantalum oxide, tin oxide, nickel oxide, silicon nitride, indium nitride, or gallium nitride. The organic material may include at least one selected from the group consisting of PEDOT, 4,4'-bis[N-(3-methylphenyl)-N-phenylamino]biphenyl (TPD), 4,4',4"-tris[(3-methylphenyl)phenylamino]triphenylamine (m-MTDATA), 1,3,5-tris[N,N-bis(2-methylphenyl)-amino]-benzene (o-MTDAB), 1,3,5-tris[N,N-bis(3-methylphenyl)-amino]-benzene (m-MTDAB), 1,3,5-tris[N,N-bis(4-methylphenyl)-amino]-benzene (p-MTDAB), 4,4'-bis[N,N-bis(3-methylphenyl)-amino]-diphenylmethane (BPPM), 4,4'-dicarbazolyl-1,1'-biphenyl (CBP), 4,4',4"-tris(N-carbazole)triphenylamine (TCTA), 2,2',2"-(1,3,5-benzenetolyl)tris-[1-phenyl-1H-benzoimidazole] (TPBI), and 3-(4-biphenyl)-4-phenyl-5-t-butylphenyl-1,2,4-triazole (TAZ).

The refractive layer 400 may further include a light extraction pattern 450. The light extraction pattern 450 may be located on a path of part of light emitted by the emission layer of the OLED 200. The light extraction pattern 450 may change a path of part of light of the third direction (e.g., the z-direction) incident on the light extraction pattern 450 from among light emitted by the emission layer of the OLED 200 so that the light travels in a direction other than the third direction (e.g., the z-direction). The light extraction pattern 450 may be located in the second opening OP2 of the first refractive layer 410, for example, in the first area A1 of the substrate 100. The light extraction pattern 450 may be provided in an island shape at substantially the center of the first area A1. The light extraction pattern 450 may have a third refractive index lower than the second refractive index of the second refractive layer 430. In an embodiment, the light extraction pattern 450 may include the same material as that of the first refractive layer 410, and may include the same refractive index as that of the first refractive layer 410. The light extraction pattern 450 and the first refractive layer 410 may be formed by using separate processes, or the light extraction pattern 450 may be concurrently (e.g., simultaneously) formed with the first refractive layer 410 by patterning a first refractive layer forming material during the formation of the first refractive layer 410.

A height H2 of the light extraction pattern 450 may be equal to or different from a height H1 of the first refractive layer 410. For example, the height H2 of the light extraction pattern 450 may be less than the height H1 of the first refractive layer 410. The term "height" refers to a maximum height of a structure from a top surface of a lower layer located under the structure. Width W3 of the light extraction pattern 450 may vary depending on the pixel. For example, the width W3 of the light extraction pattern 450 located in the first area A1 of the third pixel PX3 may be greater than the width W3 of the light extraction pattern 450 located in the first area A1 of the first pixel PX1. The width W3 of the light extraction pattern 450 located in the first area A1 of the first pixel PX1 may be greater than the width W3 of the light extraction pattern 450 located in the first area A1 of the second pixel PX2. The term "width" in reference to the width W3 refers to a maximum width of the light extraction pattern 450. When a bottom surface of the light extraction pattern 450 is greater than a top surface of the light extraction pattern 450, the width may be a maximum width of the bottom surface of the light extraction pattern 450. Each of the first refractive layer 410 surrounding the second opening OP2 and the light extraction pattern 450 may have a shape whose side surface is linear or tapered and cross-section is quadrangular or trapezoidal. An upper portion of a side surface of each of the part of the first refractive layer 410 and the light extraction pattern 450 may have a round shape.

The light extraction pattern 450 may include scattering particles. The scattering particles may be nano-size particles. For example, a particle size of each of the scattering particles may range from about 50 nm to about 1000 nm. In an embodiment, the scattering particles may be inorganic particles. For example, the scattering particles may include silica, $ZrO_2$, $TiO_2$, $Al_2O_3$, $In_2O_3$, ZnO, $SnO_2$, and $Sb_2O_3$. In an embodiment, the scattering particles may be organic particles. For example, the scattering particles may include PS, PMMA, acrylic-styrene copolymer, melamine, or PC. The scattering particles may be one kind of particle, or a combination of two or more kinds of particles.

Figure 9:
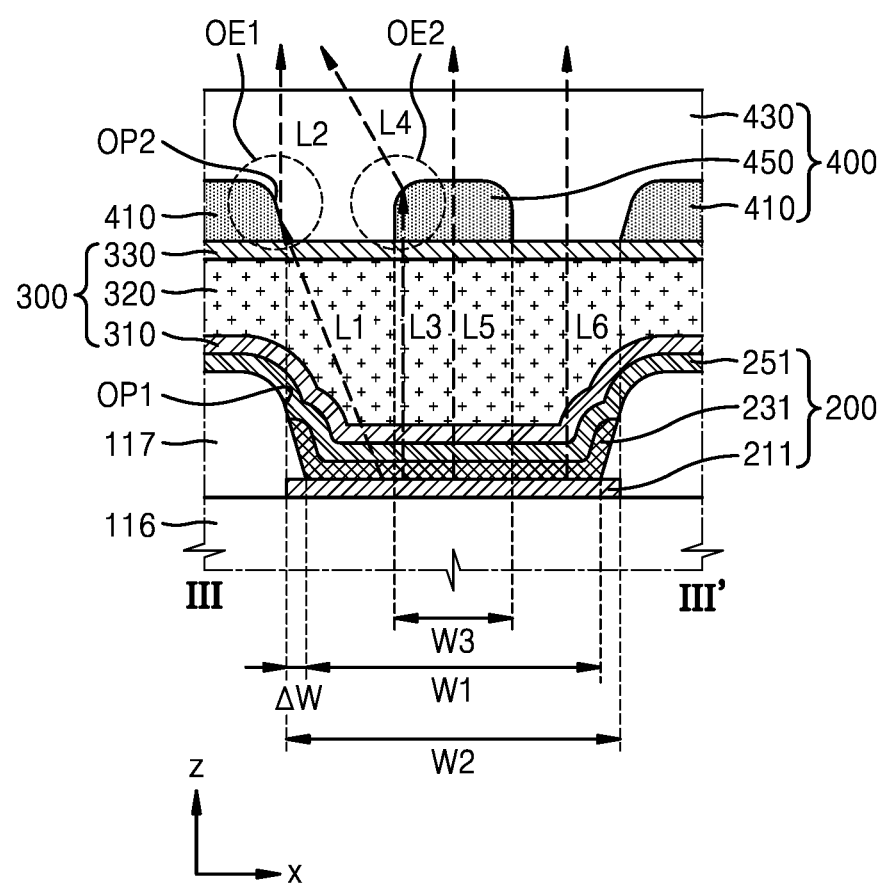
FIG. 9 is a view for describing light extraction of a refractive layer according to an embodiment of the present disclosure.

FIG. 9 is a view for describing light extraction of a refractive layer according to an embodiment of the present disclosure. FIG. 9 may be a partial enlarged view of FIG. 8.

Referring to FIG. 9, the OLED 200 may be located on an insulating surface. The insulating surface may be a top surface of at least one insulating layer on the substrate 100. For example, the insulating surface may be a top surface of the second insulating layer 116.

A second width W2 of the bottom of the second opening OP2 may be greater than a first width W1 of a bottom surface of the first opening OP1. The term "width" in reference to the first width W1 and the second width W2 refers to a maximum width of a bottom surface. A difference ΔW between the second width W2 and the first width W1 may be different for each pixel. For example, the difference ΔW between the second width W2 and the first width W1 at the third pixel PX3 may be greater than the difference ΔW between the second width W2 and the first width W1 at the first pixel PX1, and may be less than the difference ΔW between the second width W2 and the first width W1 at the second pixel PX2. Although the second width W2 of the second opening OP2 is the same as a width of the pixel electrode 211 in FIG. 9, in an embodiment, the second width W2 of the second opening OP2 may be less than the width of the pixel electrode 211.

In the area OE1 including an inner wall of the second opening OP2 of the first refractive layer 410, light L1 incident from the second refractive layer 430 on the first refractive layer 410 from among light emitted from the OLED 200 may be totally reflected at an interface between the second refractive layer 430 and the first refractive layer 410 to change a path, and totally reflected light L2 may be extracted in substantially the third direction (e.g., the z-direction). Accordingly, the area of a light-emitting pattern of a pixel generated in a front virtual area may increase. That is, due to total reflection at an interface between the first refractive layer 410 that is a low refractive layer and the second refractive layer 430 that is a high refractive layer, forward extraction efficiency may be improved and front visibility may be improved.

In the area OE2 including a side surface of the light extraction pattern 450, light L3 incident on the light extraction pattern 450 from among light emitted from the OLED 200 may be refracted at an interface between the light extraction pattern 450 and the second refractive layer 430 and refracted light L4 may be extracted in a direction other than the third direction (e.g., the z-direction). Light L5 from among light emitted from the OLED 200 may pass through the light extraction pattern 450 and may be extracted in substantially the third direction (e.g., the z-direction) without changing a direction. Light L6 from among light emitted from the OLED 200 may pass through the second refractive layer 430 without passing through the light extraction pattern 450, and may be extracted in substantially the third direction (e.g., the z-direction) without changing a direction. Although not indicated in FIG. 9, light incident from the second refractive layer 430 on the light extraction pattern 450 from among light emitted from the OLED 200 may be totally reflected at an interface between the second refractive layer 430 and the light extraction pattern 450 to change a path, and totally reflected light may be extracted in substantially the third direction (e.g., the z-direction).

When the OLED 200 emits white light, white characteristics observed at a front surface are different from white characteristics observed at a side surface. A white angle difference (WAD) is an item for evaluating a change in white characteristics according to an observation angle, and a level thereof is evaluated by measuring a luminance change amount and a color coordinate change amount according to an observation angle compared with a front surface that is perpendicular to a screen. The light extraction pattern 450 according to an embodiment of the present disclosure may change a path of light by refracting and/or scattering part of light passing through the light extraction pattern 450, thereby reducing a difference between white characteristics observed at a front surface and white characteristics observed at a side surface.

Figure 10:
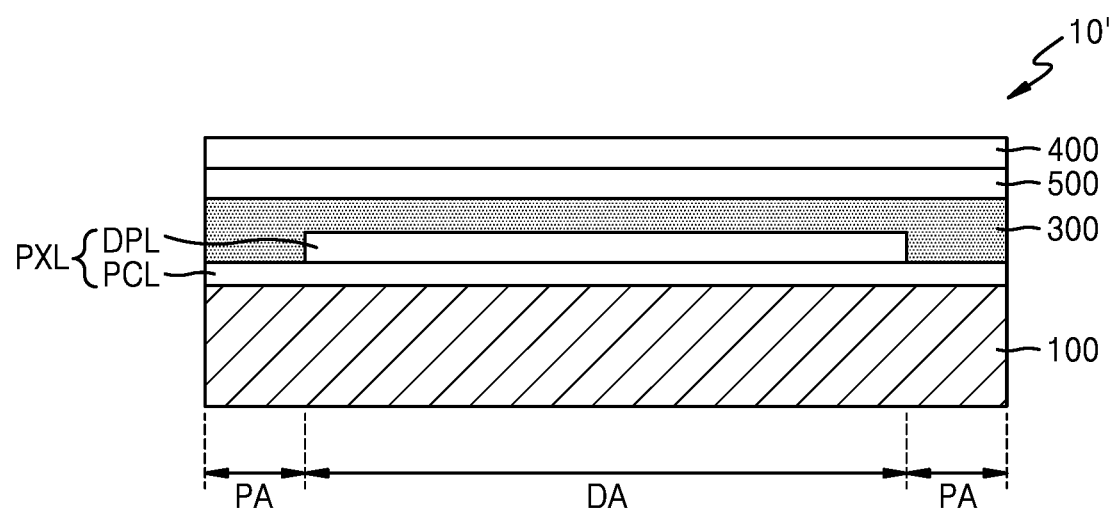
FIG. 10 is a cross-sectional view taken along the line I-I' of FIG. 1 according to an embodiment of the present disclosure.
Figure 11:
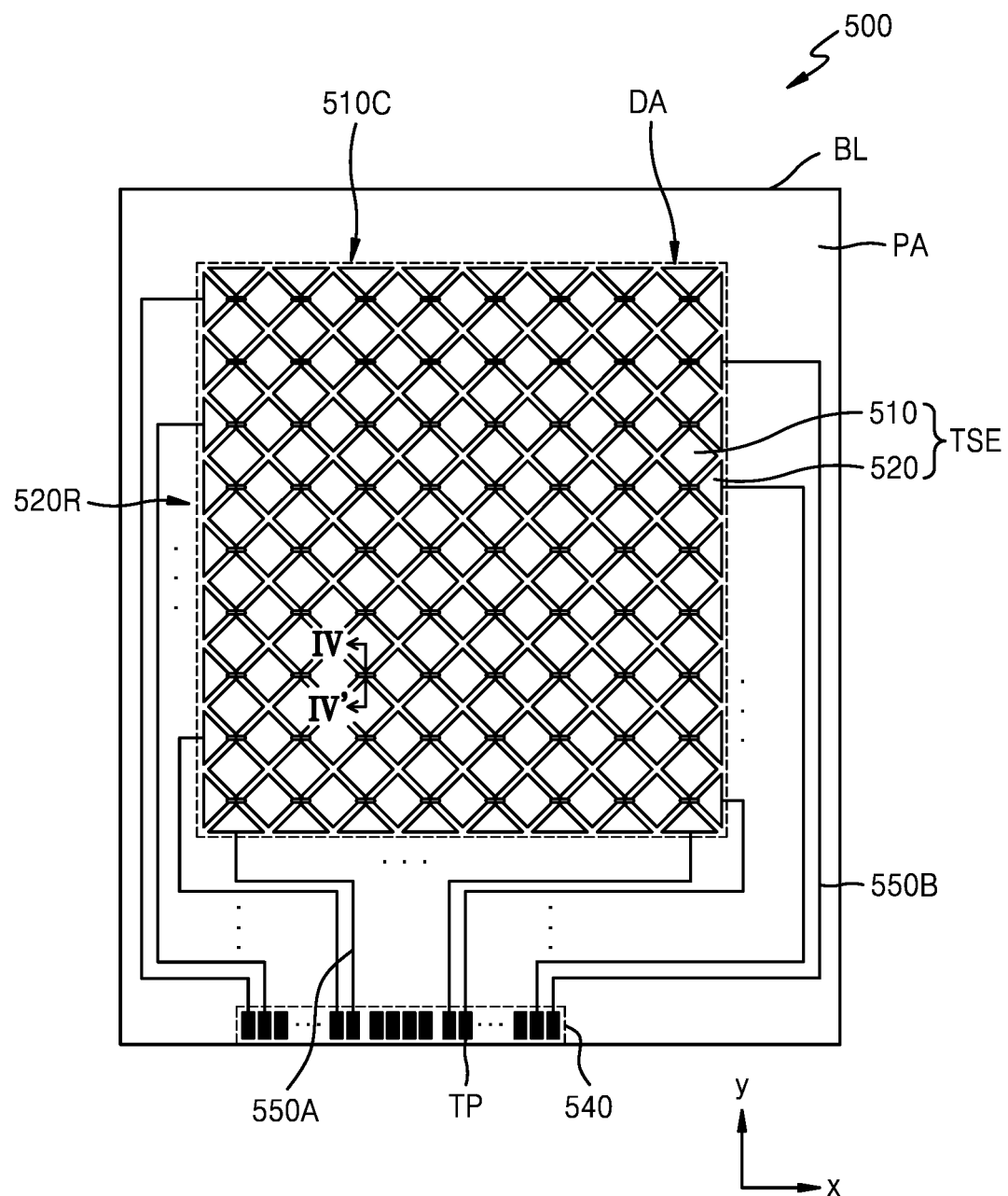
FIG. 11 is a plan view illustrating an input sensing layer of FIG. 10.
Figure 12:
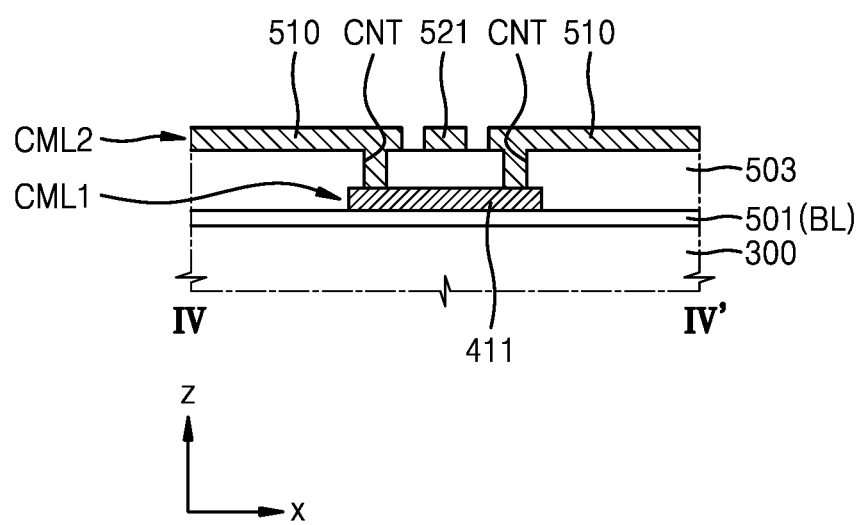
FIG. 12 is a cross-sectional view taken along the line IV-IV' of FIG. 11.
Figure 13A:
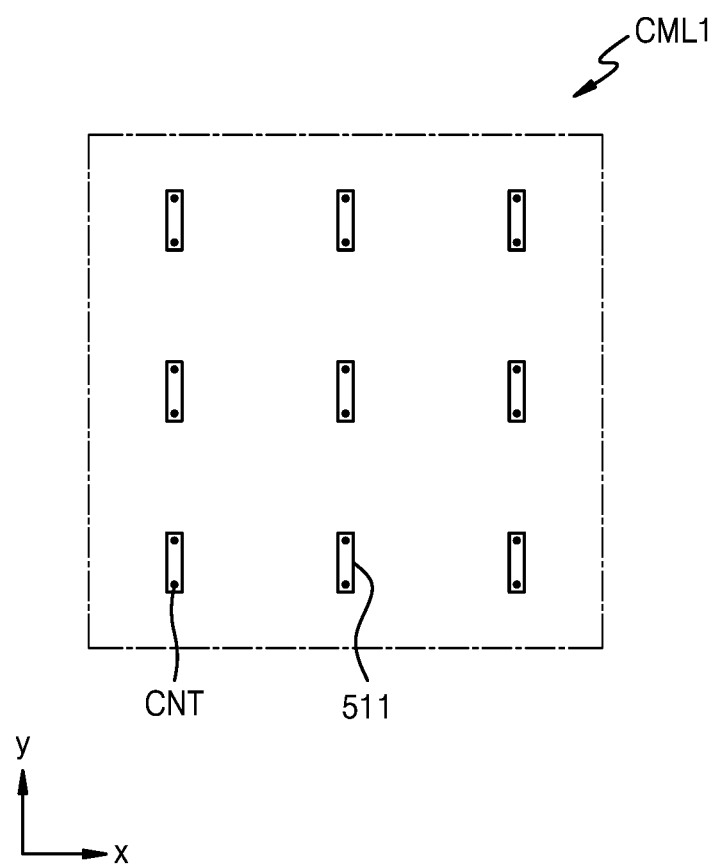
FIG. 13A is a plan view illustrating a first conductive layer of FIG. 11.
Figure 13B:
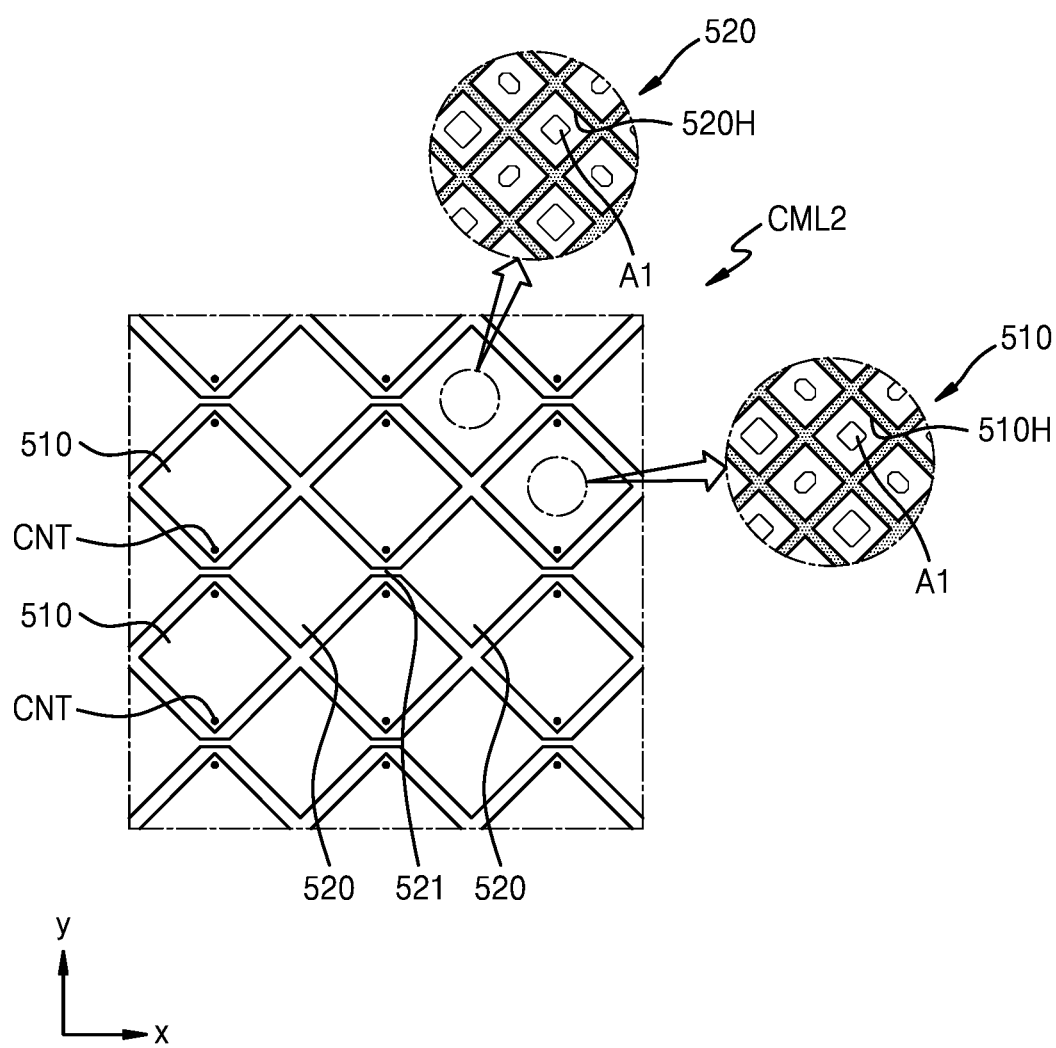
FIG. 13B is a plan view illustrating a second conductive layer of FIG. 11.
Figure 14:
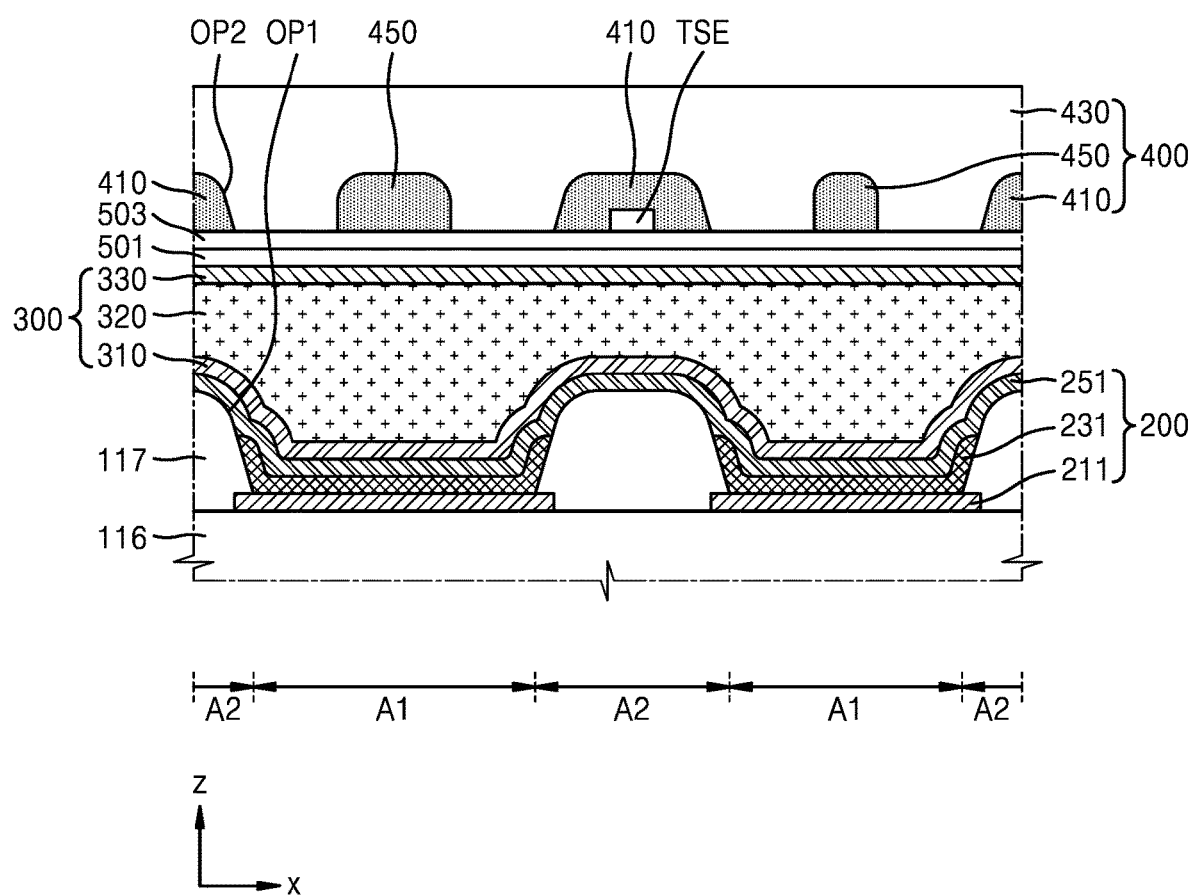
FIG. 14 is a partial cross-sectional view of a display panel according to an embodiment of the present disclosure.

FIG. 10 is a cross-sectional view taken along the line I-I' of FIG. 1 according to an embodiment of the present disclosure. FIG. 11 is a plan view illustrating an input sensing layer of FIG. 10. FIG. 12 is a cross-sectional view taken along the line IV-IV' of FIG. 11. FIG. 13A is a plan view illustrating a first conductive layer of FIG. 11, and FIG. 13B is a plan view illustrating a second conductive layer of FIG. 11. FIG. 14 is a partial cross-sectional view of a display panel according to an embodiment of the present disclosure. The same elements as those described above may not be described below.

Referring to FIG. 10, the display apparatus 1 may include a display panel 10' including the substrate 100 and the encapsulation member 300 for sealing the substrate 100 which are sequentially stacked in the third direction (e.g., the z-direction). The display panel 10' may further include an input sensing layer 500 and the refractive layer 400 on the encapsulation member 300. In FIG. 10, for example, the refractive layer 400 is on the encapsulation member 300 with the input sensing layer 500 interposed therebetween.

Referring to FIG. 11, the input sensing layer 500 may include a base layer BL including the display area DA and the peripheral area PA. The base layer BL may correspond to the substrate 100 of the display panel 10', and may have substantially the same shape as that of the substrate 100. In an embodiment, the base layer BL may be a part of the encapsulation member 300 of the display panel 10', for example, the second inorganic layer 330 (see FIG. 14) located on an uppermost layer of the encapsulation member 300. In an embodiment, the base layer BL may be an insulating substrate or an insulating film formed of an insulating material such as glass or a polymer resin separate from the encapsulation member 300.

A plurality of sensing electrodes TSE may be located in the display area DA. Sensing signal lines connected to the sensing electrodes TSE may be located in the peripheral area PA. The sensing electrodes TSE may include first sensing electrodes 510 and second sensing electrodes 520. The sensing signal lines may include first sensing signal lines 550A and second sensing signal lines 550B. That is, the input sensing layer 500 may include the first sensing electrodes 510, the first sensing signal lines 550A connected to the first sensing electrodes 510, the second sensing electrodes 520, and the second sensing signal lines 550B connected to the second sensing electrodes 520. The input sensing layer 500 may sense an external input by using a mutual capacitance method and/or a self-capacitance method.

The input sensing layer 500 may include a plurality of conductive layers. Referring to FIG. 12, the input sensing layer 500 may include a first conductive layer CML1 and a second conductive layer CML2. A first insulating layer 501 as the base layer BL may be located between the first conductive layer CML1 and the encapsulation member 300 and a second insulating layer 503 may be located between the first conductive layer CML1 and the second conductive layer CML2.

In an embodiment, each of the first and second insulating layers 501 and 503 may be an inorganic insulating layer formed of, for example, silicon nitride. In an embodiment, the first insulating layer 501 may be omitted and the first conductive layer CML1 may be directly located on the encapsulation member 300. In an embodiment, each of the first and second insulating layers 501 and 503 may be an organic insulating layer.

The first conductive layer CML1 may include first connection electrodes 511 as shown in FIG. 13A. The second conductive layer CML2 may include first sensing electrodes 510, second sensing electrodes 520, and second connection electrodes 521 as shown in FIG. 13B. The second sensing electrodes 520 may be connected to one another by the second connection electrodes 521 that are formed on the same layer as the second sensing electrodes 520. The first sensing electrodes 510 may be connected to one another by the first connection electrodes 511 that are formed on a different layer from the first sensing electrodes 510. The first connection electrode 511 that electrically connects adjacent first sensing electrodes 510 may be connected to the adjacent first sensing electrodes 510 through a contact hole CNT formed in the second insulating layer 503.

Each of the first and second conductive layers CML1 and CML2 includes a metal. For example, each of the first and second conductive layers CML1 and CML2 may include, for example, Mo, Al, Cu, and/or Ti, and may have a single-layer or multi-layer structure including the above material. In an embodiment, each of the first and second conductive layers CML1 and CML2 may have a multi-layer structure formed of Ti/Al/Ti.

Referring to FIG. 13B, the first sensing electrodes 510 and the second sensing electrodes 520 may have substantially diamond shapes. The first sensing electrode 510 may have a grid structure (or a lattice structure) having a plurality of holes 510H. The hole 510H may be formed to overlap the first area A1 of a pixel. Likewise, the second sensing electrode 520 may have a grid structure (or a lattice structure) having a plurality of holes 520H. The hole 520H may be formed to overlap the first area A1 of a pixel. The holes 510H and 520H may have different sizes. Line widths of lattice lines may be several micrometers. In FIG. 14, the first insulating layer 501 on the encapsulation member 300, the second insulating layer 503, and the sensing electrode TSE on the second insulating layer 503 are illustrated. The sensing electrode TSE of FIG. 14 that is a part of a lattice line of the first sensing electrode 510 or the second sensing electrode 520 may be located to correspond to the second area A2 of a pixel.

The first sensing electrodes 510 may be arranged in the y-direction, and the second sensing electrodes 520 may be arranged in the x-direction that intersects the y-direction. The first sensing electrodes 510 arranged in the y-direction may be connected to one another by the first connection electrode 511 between adjacent first sensing electrodes 510, to form first sensing lines 510C. The second sensing electrodes 520 arranged in the x-direction may be connected to one another by the second connection electrodes 521 between adjacent second sensing electrodes 520, to form second sensing lines 520R. The first sensing lines 510C and the second sensing lines 520R may cross each other. In an embodiment, the first sensing lines 510C and the second sensing lines 520R may be perpendicular to each other when viewed in a plan view.

The first sensing lines 510C and the second sensing lines 520R may be located in the display area DA, and may be connected to a sensing signal pad TP of a pad unit 540 through the first sensing signal lines 550A and the second sensing signal lines 550B formed in the peripheral area PA. The first sensing lines 510C may be respectively connected to the first sensing signal lines 550A, and the second sensing lines 520R may be respectively connected to the second sensing signal lines 550B The first refractive layer 410 may be located on the second insulating layer 503. The first refractive layer 410 may cover the sensing electrode TSE. The light extraction pattern 450 may be located in the second opening OP2 of the first refractive layer 410. The second refractive layer 430 may be located on the first refractive layer 410 and the light extraction pattern 450.

In an embodiment, the display panel 10' may further include a color control member such as a color filter between the input sensing layer 500 and the refractive layer 400.

In the above embodiments, a profile (shapes of a top surface and a side surface) of the first refractive layer 410 and a profile (a shape of a side surface) of the light extraction pattern 450 are the same as or like each other. In an embodiment, a profile of the light extraction pattern 450 may be different from that of the first refractive layer 410 according to an arrangement of pixels and/or emission characteristics of the pixels. At least one of a shape and a size of the light extraction pattern 450 and the number (density) and arrangement of the light extraction patterns 450 in the second opening OP2 may be different for each pixel according to an arrangement of pixels and/or emission characteristics of the pixels.

Figure 15:
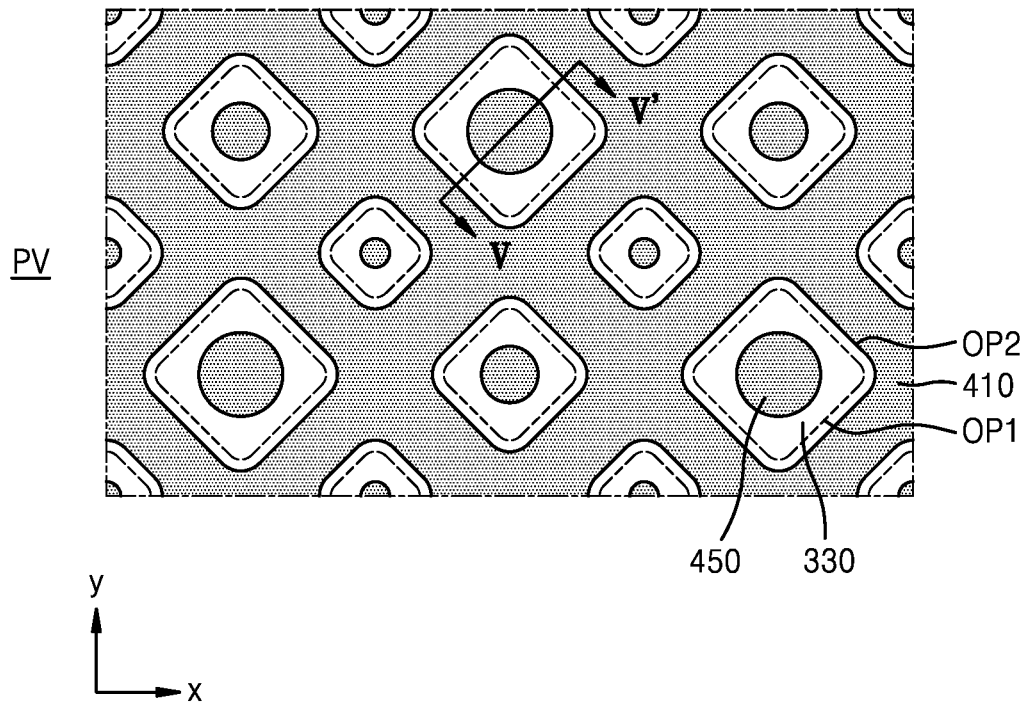
FIGS. 15-17 are views illustrating a refractive layer according to an embodiment of the present disclosure.
Figure 15:
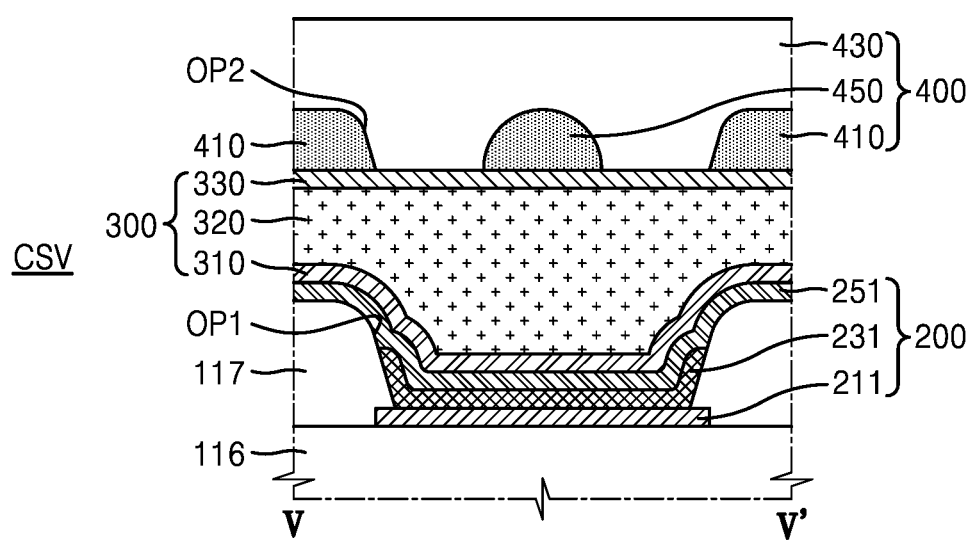
Figure 16:
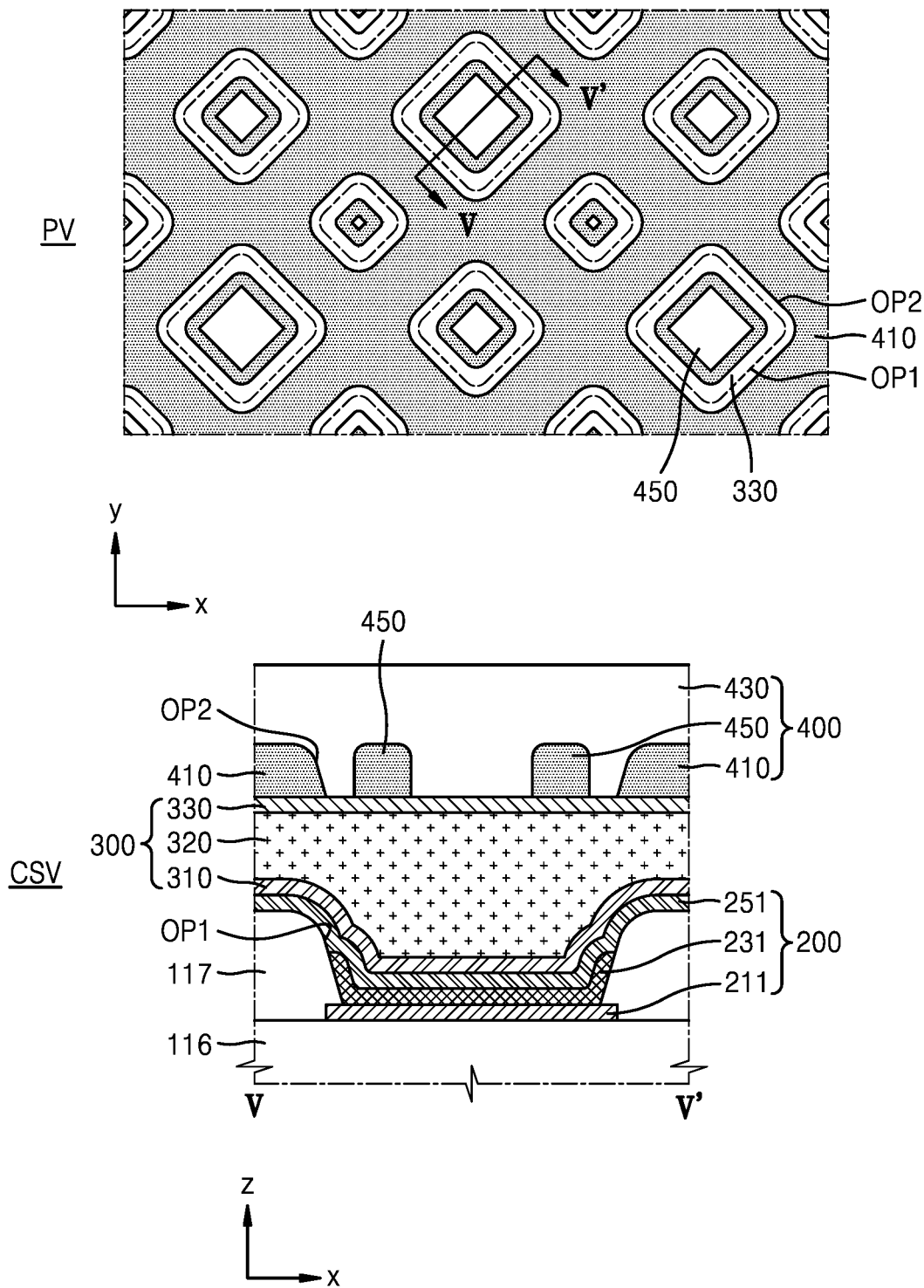
Figure 17:
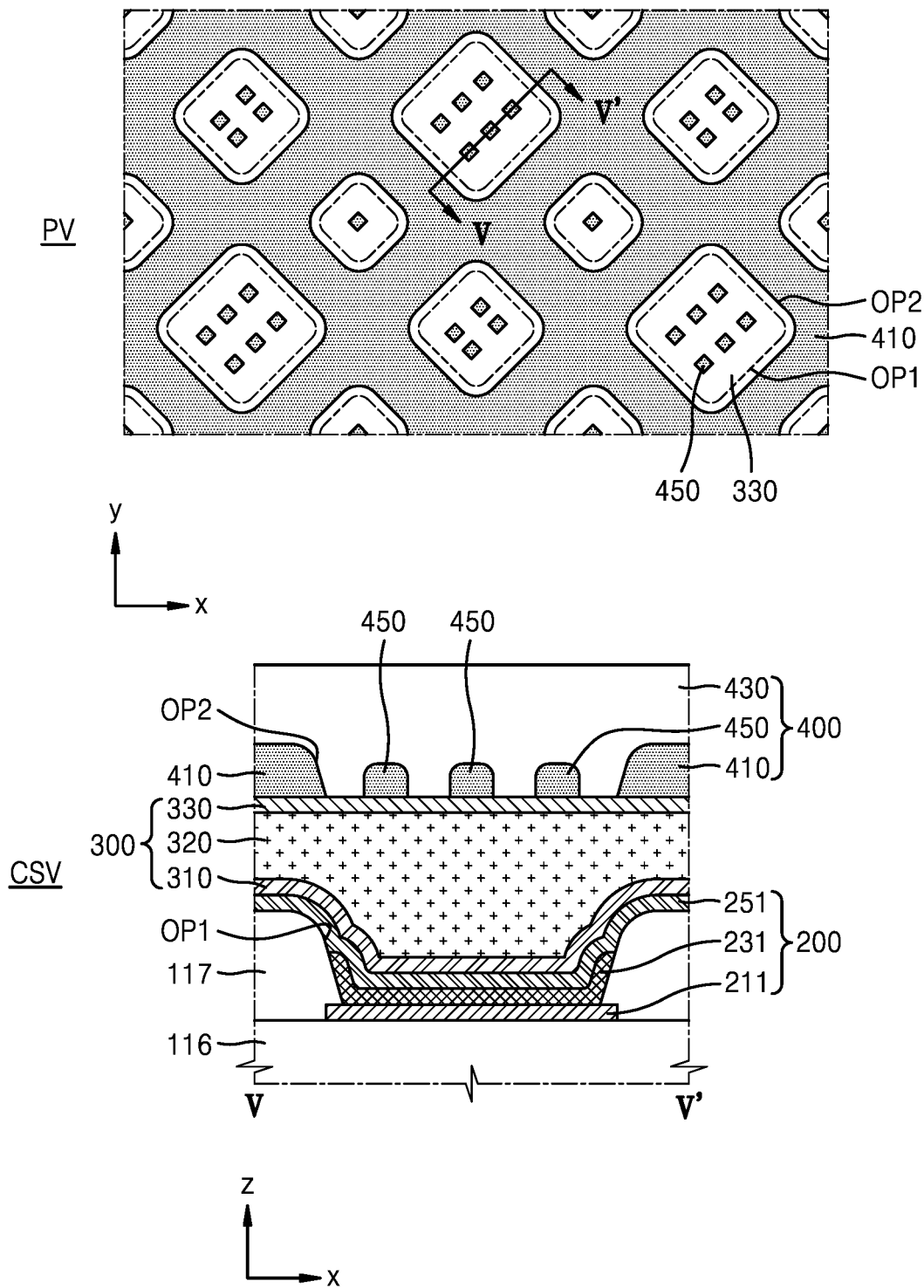

FIGS. 15-17 are views illustrating a refractive layer according to an embodiment of the present disclosure. In this case, a plan view PV of each of FIGS. 15-17 refers to a top down view of the drawings defined in an x-y plane, and a cross-sectional view CSV refers to a view taken along the line V-V of the plan view PV.

Referring to FIG. 15, the light extraction pattern 450 may be provided in an island shape at substantially the center of the first area A1 of the substrate 100. A side surface of the first refractive layer 410 surrounding the second opening OP2 may have a linear or tapered shape. The light extraction pattern 450 may have a hemispherical shape whose side surface is round and cross-section is semicircular. An upper portion of a side surface of the first refractive layer 410 may have a round shape. In the plan view PV, an outline of a bottom surface of the light extraction pattern 450 is marked by a solid line. A width of a bottom surface of the light extraction pattern 450 may be different for each pixel. In FIG. 15, as a size of the pixel electrode 211 increases, a size of the light extraction pattern 450 or a width of a bottom surface may increase. A height of the light extraction pattern 450 may be equal to or less than a height of the first refractive layer 410.

Referring to FIG. 16, the light extraction pattern 450 may be spaced apart by a predetermined (or set) interval from a side surface of the first refractive layer 410 surrounding the second opening OP2, and may have a closed loop shape that makes a continuous round along an edge of the second opening OP2. The light extraction pattern 450 may have a line shape whose cross-section is quadrangular. A side surface of each of the first refractive layer 410 surrounding the second opening OP2 and the light extraction pattern 450 may have a linear or tapered shape. An upper portion of a side surface of each of the first refractive layer 410 surrounding the second opening OP2 and the light extraction pattern 450 may have a round shape. In the plan view PV, an outline of a bottom surface of the light extraction pattern 450 is marked by a solid line. A total length of the light extraction pattern 450 may be different for each pixel. In FIG. 16, as a size of the pixel electrode 211 increases, a total length of the light extraction pattern 450 may increase. A height of the light extraction pattern 450 may be equal to or less than a height of the first refractive layer 410.

Referring to FIG. 17, one or more light extraction patterns 450 may be provided in island shapes at substantially the center of the first area A1. A side surface of each of the first refractive layer 410 surrounding the second opening OP2 and the light extraction pattern 450 may have a linear or tapered shape. An upper portion of a side surface of the first refractive layer 410 surrounding the second opening OP2 may have a round shape. In the plan view PV, an outline of a bottom surface of the light extraction pattern 450 is marked by a solid line. A width of a bottom surface of the light extraction pattern 450 may be the same for each pixel, and the number of the light extraction patterns 450 may vary depending on the pixel. For example, in FIG. 17, six light extraction patterns 450 are provided in the first area A1 of the third pixel PX3, four light extraction patterns 450 are provided in the first area A1 of the first pixel PX1, and one light extraction pattern 450 is provided in the first area A1 of the second pixel PX2. As a size of the pixel electrode 211 increases, the number of the light extraction patterns 450 may increase. A height of the light extraction pattern 450 may be equal to or less than a height of the first refractive layer 410.

Figure 18:
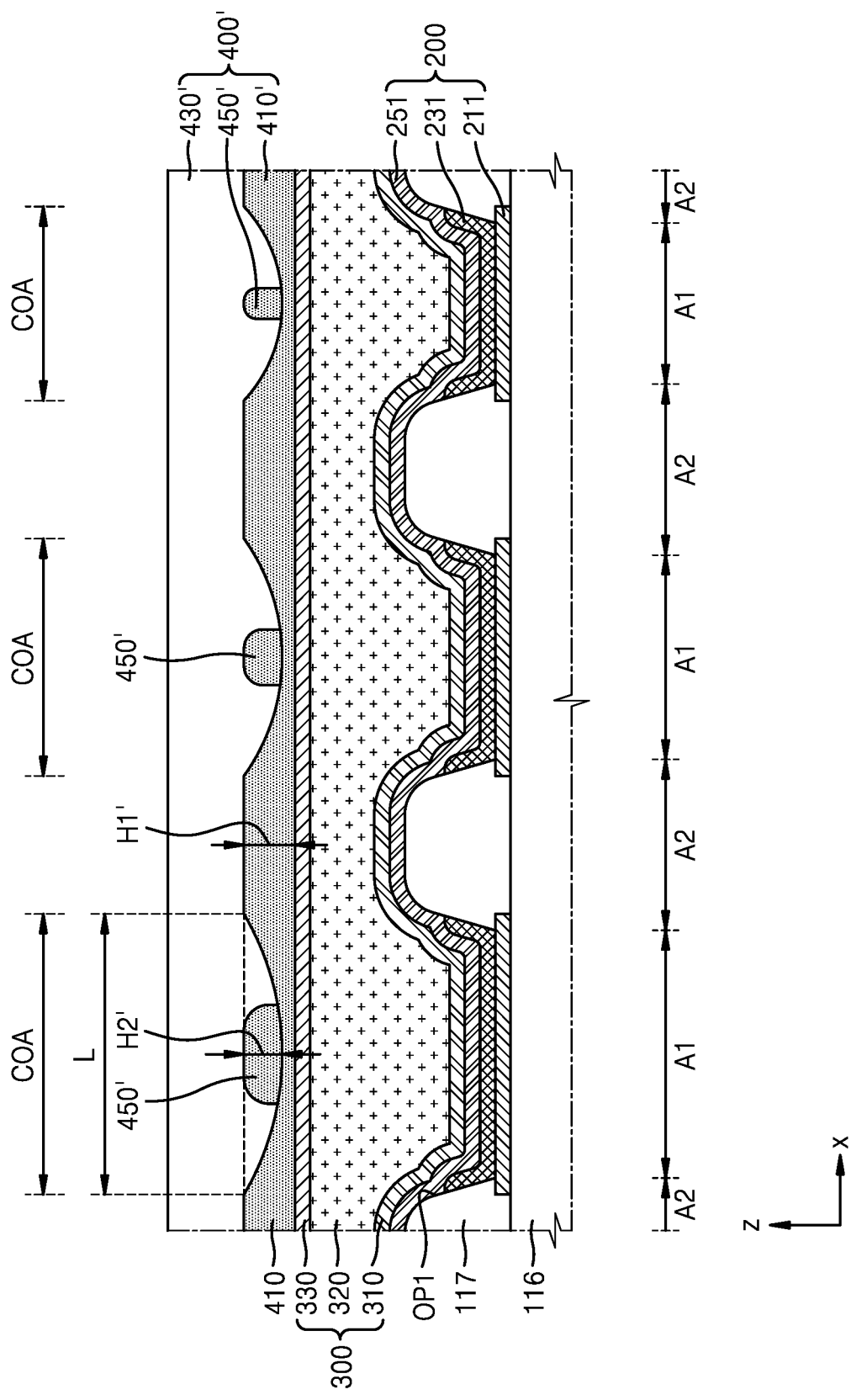
FIG. 18 is a cross-sectional view of a refractive layer according to an embodiment of the present disclosure.

FIG. 18 is a cross-sectional view illustrating a refractive layer according to an embodiment of the present disclosure.

Referring to FIG. 18, a refractive layer 400' may include a first refractive layer 410', a second refractive layer 430', and a light extraction pattern 450'. In the embodiment of FIG. 18, the first refractive layer 410' has no opening.

The first refractive layer 410' may be located on the encapsulation member 300, and may have a concave portion COA that is concave toward the substrate 100 and a non-concave portion other than the concave portion COA. The concave portion COA may be a portion corresponding to the OLED 200. The concave portion COA may be a portion corresponding to the first area A1 of the substrate 100 or the pixel PX. The non-concave portion between adjacent concave portions COA may be a portion corresponding to the second area A2 of the substrate 100 or the pixel PX. A top surface of the concave portion COA of the first refractive layer 410' may be concave and a top surface of the non-concave portion of the first refractive layer 410' may be substantially flat. A thickness (or height) H2' of the concave portion COA of the first refractive layer 410' may be about $\frac{2}{5}$ to $\frac{3}{5}$ of a thickness (or height) H1' of the first refractive layer 410'. The thickness H2' of the concave portion COA may be a maximum depth of the concave portion COA. A diameter L of the concave portion COA may vary according to the area of the first opening OP1 of the third insulating layer 117.

The second refractive layer 430' may fill the concave portion COA of the first refractive layer 410' and may be located on the first refractive layer 410'. Accordingly, the second refractive layer 430' may have a convex surface corresponding to the concave portion COA of the first refractive layer 410'. The second refractive layer 430' may cover an entire surface over the substrate 100, and may have a top surface that is substantially flat. The second refractive layer 430' may have a higher (or greater) refractive index than that of the first refractive layer 410'. The light extraction pattern 450' may be located between the first refractive layer 410' and the second refractive layer 430'.

The light extraction pattern 450' may be provided in an island shape at substantially the center of a concave surface of the concave portion COA. The light extraction pattern 450' may have the same refractive index as that of the first refractive layer 410'. The light extraction pattern 450' and the first refractive layer 410' may be formed by using separate processes, or may be concurrently (e.g., simultaneously) formed so that the light extraction pattern 450' protrudes from the first refractive layer 410'. In FIG. 18, a height of the light extraction pattern 450' is the same as the thickness H2' of the concave portion COA of the first refractive layer 410'. In an embodiment, a height of the light extraction pattern 450' may be less than the thickness H2' of the concave portion COA of the first refractive layer 410'.

For example, a top surface of the light extraction pattern 450' and a top surface of a non-concave surface of the first refractive layer 410' may be the same, or a top surface of the light extraction pattern 450' may be less than a top surface of a non-concave surface of the first refractive layer 410'. Although not shown in FIG. 18, the input sensing layer 500 (see FIG. 10) may be further provided between the encapsulation member 300 and the refractive layer 400'.

At least one of a shape and size of the light extraction pattern 450' and the number and arrangement of the light extraction patterns 450' in the concave portion COA may be different for each pixel according to an arrangement of pixels and/or emission characteristics of the pixels as described with reference to FIGS. 8 and 15-17.

A display apparatus according to embodiments of the present disclosure may improve light efficiency extracted at a front surface of the display apparatus by providing a refractive layer including a low refractive layer and a high refractive layer. Also, the display apparatus may improve color shift of light emitted to a side surface by locating a light extraction pattern that is a patterned structure on a path through which light between the low refractive layer and the high refractive layer is emitted. Accordingly, when the display apparatus is observed at various angles, the display apparatus may form a clear image irrespective of an observation angle.

The one or more embodiments of the present disclosure may provide a display apparatus that may improve efficiency of light extracted in the display apparatus and may emit light having a uniform luminance distribution even when a user's observation angle changes. However, the above effects are merely examples, and effects according to the embodiments are described in detail through the description.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and equivalents thereof.

What is claimed is:

1. A display apparatus comprising:
   a display element configured to emit light;
   a first refractive layer on the display element, the first refractive layer having a top surface with a concave surface corresponding to the display element;
   a light extraction pattern on the concave surface of the first refractive layer and having an island shape, the light extraction pattern having a size less than an area of the concave surface in a plan view; and
   a second refractive layer on the first refractive layer, the second refractive layer covering the first refractive layer and the light extraction pattern.

2. The display apparatus of claim 1, further comprising an encapsulation member between the display element and the first refractive layer.

3. The display apparatus of claim 2, further comprising
   an input sensing layer between the encapsulation member and the first refractive layer and comprising a sensing electrode.

4. The display apparatus of claim 1, wherein
   a refractive index of the second refractive layer is greater than a refractive index of the first refractive layer.

5. The display apparatus of claim 1, wherein
   a refractive index of the light extraction pattern is equal to a refractive index of the first refractive layer.

6. The display apparatus of claim 1, wherein
   a height of a top surface of the light extraction pattern and a height of a top surface of a non-concave surface of the first refractive layer are the same.

7. The display apparatus of claim 1, wherein
   a height of a top surface of the light extraction pattern is less than a height of a top surface of a non-concave surface of the first refractive layer.

8. The display apparatus of claim 1, wherein
   the display element comprises a first display element configured to emit light of a first color and a second display element configured to emit light of a second color,
   wherein the light extraction pattern on the concave surface of the first refractive layer corresponding to the first display element and the light extraction pattern on the concave surface of the first refractive layer corresponding to the second display element are different from each other in at least one of a shape, a size, and a number.

* * * * *